US012633365B2

(12) United States Patent     (10) Patent No.:   US 12,633,365 B2
Zhang et al.     (45) Date of Patent:    May 19, 2026

(54) SHIFT REGISTER, DRIVE CIRCUIT, DRIVE METHOD, DISPLAY PANEL, AND DISPLAY APPARATUS

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Jingwen Zhang, Beijing (CN); Yao Huang, Beijing (CN); Binyan Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 190 days.

(21) Appl. No.: 18/576,414

(22) PCT Filed: May 24, 2023

(86) PCT No.: PCT/CN2023/096056
§ 371 (c)(1),
(2) Date: Jan. 4, 2024

(87) PCT Pub. No.: WO2023/227027
PCT Pub. Date: Nov. 30, 2023

(65) Prior Publication Data
US 2025/0078943 A1     Mar. 6, 2025

(30) Foreign Application Priority Data
May 27, 2022    (CN) .......................... 202210612262.8

(51) Int. Cl.
   *G11C 19/28*     (2006.01)
   *G09G 3/3266*     (2016.01)
   (Continued)

(52) U.S. Cl.
   CPC ........... *G11C 19/28* (2013.01); *G09G 3/3266* (2013.01); *H10K 59/1201* (2023.02);
   (Continued)

(58) Field of Classification Search
   CPC .. G11C 19/28; H10K 59/1201; H10K 59/126; G09G 3/3266; G09G 2300/0408; G09G 2310/0286
   See application file for complete search history.

(56) References Cited

U.S. PATENT DOCUMENTS 9,059,687 B2 *   6/2015   Ramaraju ........ H03K 3/356156
10,453,386 B2   10/2019   Jang
(Continued)

FOREIGN PATENT DOCUMENTS

CN    209265989 U    8/2019
CN    112771601 A    5/2021
(Continued)

*Primary Examiner* — Sejoon Ahn
(74) *Attorney, Agent, or Firm* — WHDA, LLP

(57)       ABSTRACT

This disclosure provides a shift register, drive circuit, drive method, display panel, and display apparatus. The shift register includes an input unit, a first control unit, an output unit and an isolation unit, wherein the input unit provides a starting signal of a signal input terminal to a first node, and provides a first signal of a first signal terminal to a second node, so that under control of the second node and a second clock signal terminal, the first control unit provides a second clock signal of the second clock signal terminal to a third node; under control of the third node, the isolation unit provides a voltage signal of the first node to a fourth node; and under control of the fourth node and the third node, the (Continued)

output unit outputs based on the first signal or a second signal of the second signal terminal.

18 Claims, 9 Drawing Sheets

(51) Int. Cl.
  H10K 59/12 (2023.01)
  H10K 59/126 (2023.01)

(52) U.S. Cl.
  CPC ... H10K 59/126 (2023.02); *G09G 2300/0408* (2013.01); *G09G 2310/0286* (2013.01)

(56) References Cited

U.S. PATENT DOCUMENTS

| | | | | |
|---|---|---|---|---|
| 11,210,987 | B2 * | 12/2021 | Cheng | G11C 19/28 |
| 2013/0027377 | A1 * | 1/2013 | Yang | G09G 3/3677 |
| | | | | 345/212 |
| 2013/0033468 | A1 | 2/2013 | Takahashi | |
| 2013/0222352 | A1 * | 8/2013 | Jeong | G11C 19/184 |
| | | | | 345/205 |
| 2014/0043373 | A1 * | 2/2014 | Kim | G09G 3/20 |
| | | | | 345/690 |
| 2014/0078029 | A1 * | 3/2014 | Jang | H03L 7/00 |
| | | | | 345/82 |
| 2017/0039969 | A1 * | 2/2017 | Wang | G09G 3/3677 |
| 2017/0186360 | A1 * | 6/2017 | Ma | G09G 3/3266 |
| 2021/0091149 | A1 * | 3/2021 | Liang | H10K 59/124 |
| 2021/0366354 | A1 | 11/2021 | Li et al. | |
| 2021/0366401 | A1 * | 11/2021 | Feng | G11C 19/28 |
| 2022/0359790 | A1 * | 11/2022 | Lee | H01L 25/0753 |
| 2022/0383820 | A1 | 12/2022 | Zeng et al. | |
| 2023/0162685 | A1 * | 5/2023 | Lu | G09G 3/3266 |
| | | | | 345/204 |
| 2023/0245609 | A1 * | 8/2023 | Yan | G11C 19/28 |
| | | | | 345/204 |
| 2024/0249786 | A1 * | 7/2024 | Huang | G09G 3/3266 |
| 2025/0078943 | A1 * | 3/2025 | Zhang | G09G 3/3266 |

FOREIGN PATENT DOCUMENTS

| | | |
|---|---|---|
| CN | 114937471 A | 8/2022 |
| WO | 2011/148658 A1 | 12/2011 |

* cited by examiner

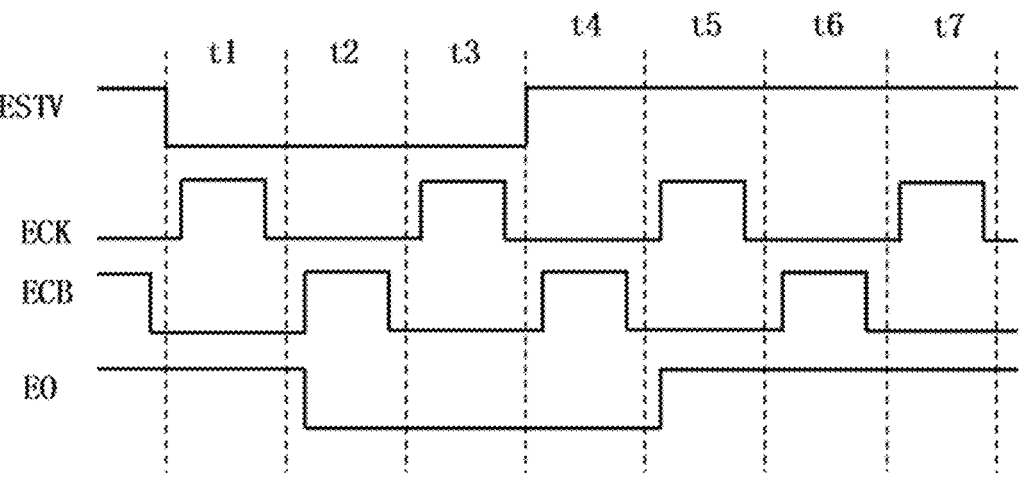

Fig. 5

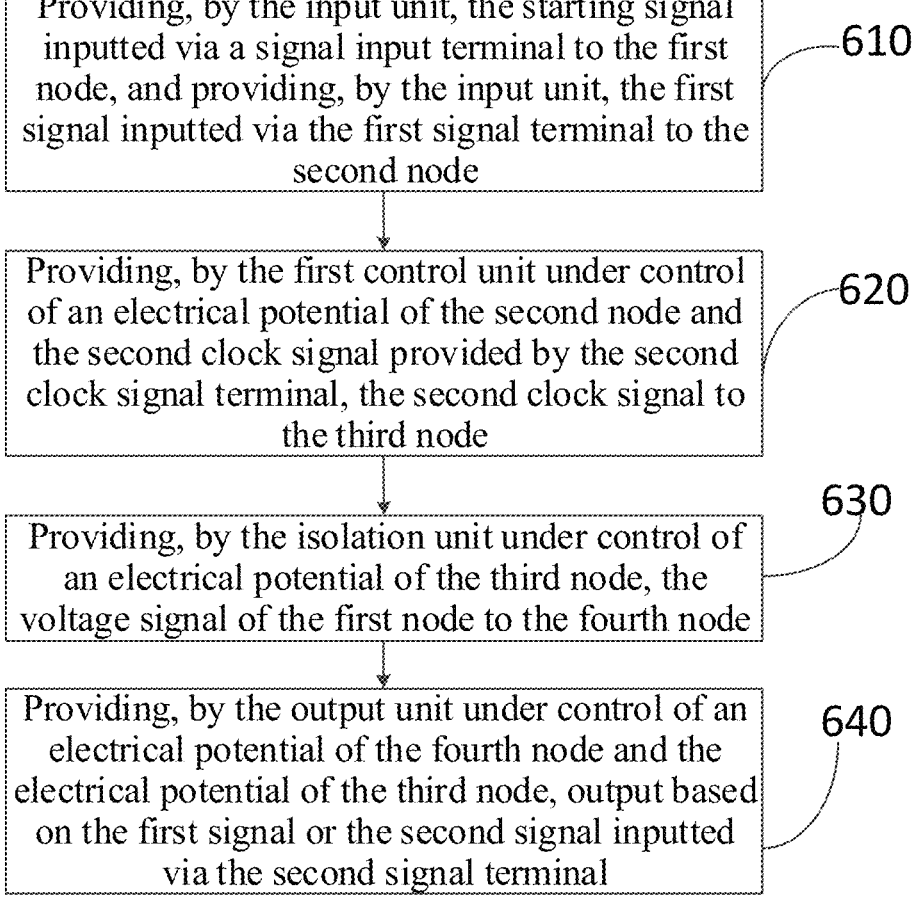

Providing, by the input unit, the starting signal inputted via a signal input terminal to the first node, and providing, by the input unit, the first signal inputted via the first signal terminal to the second node ⎯610

Providing, by the first control unit under control of an electrical potential of the second node and the second clock signal provided by the second clock signal terminal, the second clock signal to the third node ⎯620

Providing, by the isolation unit under control of an electrical potential of the third node, the voltage signal of the first node to the fourth node ⎯630

Providing, by the output unit under control of an electrical potential of the fourth node and the electrical potential of the third node, output based on the first signal or the second signal inputted via the second signal terminal ⎯640

Fig. 6

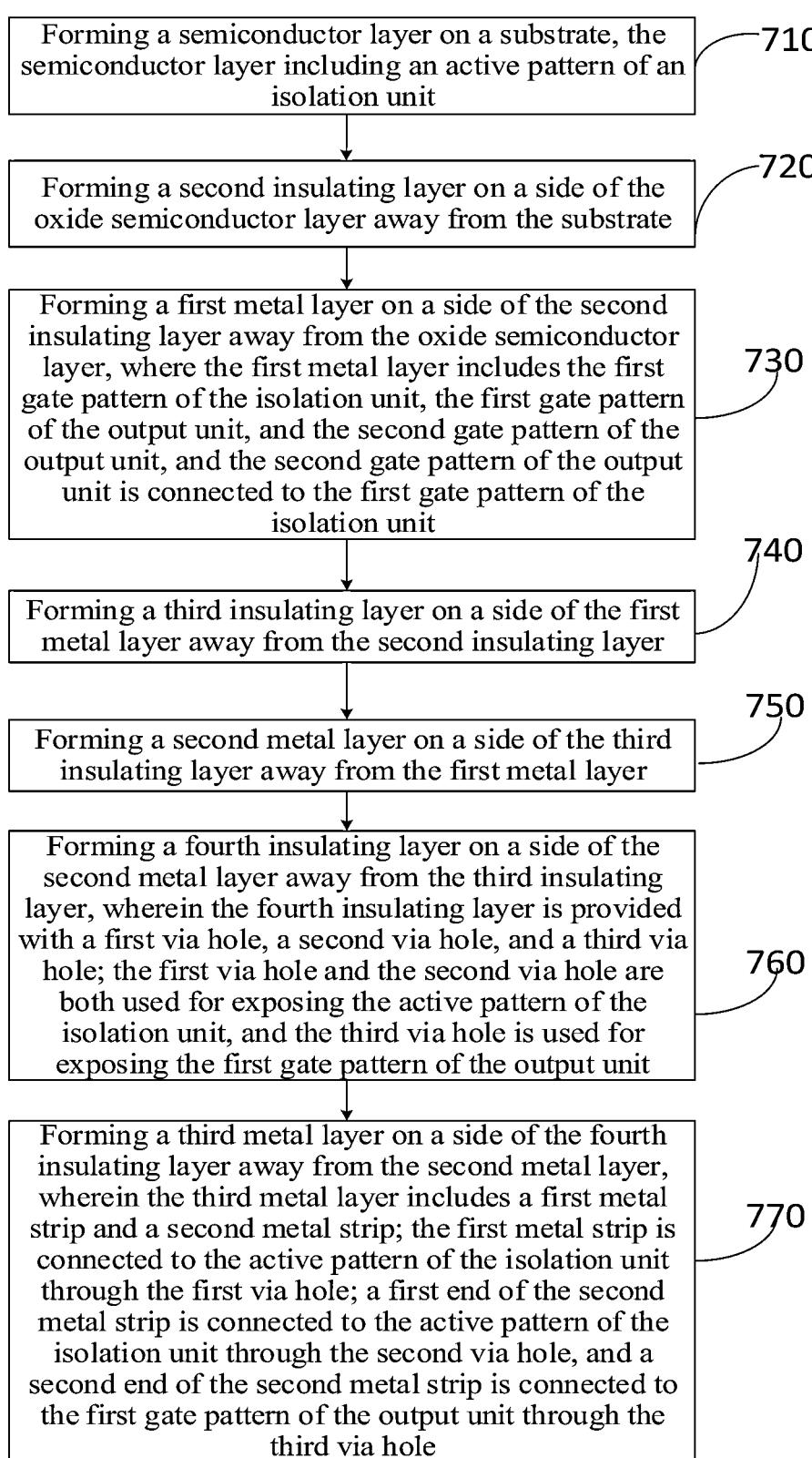

Forming a semiconductor layer on a substrate, the semiconductor layer including an active pattern of an isolation unit — 710

Forming a second insulating layer on a side of the oxide semiconductor layer away from the substrate — 720

Forming a first metal layer on a side of the second insulating layer away from the oxide semiconductor layer, where the first metal layer includes the first gate pattern of the isolation unit, the first gate pattern of the output unit, and the second gate pattern of the output unit, and the second gate pattern of the output unit is connected to the first gate pattern of the isolation unit — 730

Forming a third insulating layer on a side of the first metal layer away from the second insulating layer — 740

Forming a second metal layer on a side of the third insulating layer away from the first metal layer — 750

Forming a fourth insulating layer on a side of the second metal layer away from the third insulating layer, wherein the fourth insulating layer is provided with a first via hole, a second via hole, and a third via hole; the first via hole and the second via hole are both used for exposing the active pattern of the isolation unit, and the third via hole is used for exposing the first gate pattern of the output unit — 760

Forming a third metal layer on a side of the fourth insulating layer away from the second metal layer, wherein the third metal layer includes a first metal strip and a second metal strip; the first metal strip is connected to the active pattern of the isolation unit through the first via hole; a first end of the second metal strip is connected to the active pattern of the isolation unit through the second via hole, and a second end of the second metal strip is connected to the first gate pattern of the output unit through the third via hole — 770

Fig. 7

SHIFT REGISTER, DRIVE CIRCUIT, DRIVE METHOD, DISPLAY PANEL, AND DISPLAY APPARATUS

CROSS-REFERENCE TO RELATED APPLICATION

This application is the U.S. national phase of PCT Application No. PCT/CN2023/096056 filed on May 24, 2023, which claims priority to Chinese Patent Application No. 202210612262.8 filed on May 27, 2022, disclosures of which are incorporated herein by reference in their entireties.

TECHNICAL FIELD

The present disclosure relates to the field of display technology, and particularly to a shift register, a drive circuit, a drive method, a display panel, and a display apparatus.

BACKGROUND

The gate drive on array (GOA) is an important auxiliary circuit in the active-matrix organic light-emitting diode (AMOLED) display panel, and is essentially a shift register circuit for driving pixels in an active area (AA) row by row to emit light. GOA shall avoid outputting a floating state for a long time. In case that the floating state is outputted for a long time, the output signal is easily interfered by other signals, resulting in not good (NG) phenomenon.

SUMMARY

In one aspect, an embodiment of the present disclosure provides a shift register, including an input unit, a first control unit, an output unit, and an isolation unit;

the input unit is used for providing a starting signal inputted via a signal input terminal to a first node and providing a first signal inputted via a first signal terminal to a second node;

the first control unit is used for providing a second clock signal provided by a second clock signal terminal to a third node under control of an electrical potential of the second node and the second clock signal;

the isolation unit is used for providing a voltage signal of the first node to a fourth node under control of an electrical potential of the third node;

the output unit is used for providing output based on the first signal or a second signal of a second signal terminal under control of an electrical potential of the fourth node and the electrical potential of the third node.

Optionally, the isolation unit includes a separator transistor;

a gate electrode of the separator transistor is connected to the fourth node, a first electrode of the separator transistor is connected to the first node, and a second electrode of the separator transistor is connected to the fourth node.

Optionally, the input unit includes a first transistor, a second transistor, and a third transistor;

a gate electrode of the first transistor is connected to a first clock signal terminal, a first electrode of the first transistor is connected to the signal input terminal, and a second electrode of the first transistor is connected to the first node;

a gate electrode of the second transistor is connected to the first node, a first electrode of the second transistor is connected to the first clock signal terminal, and a second electrode of the second transistor is connected to the second node;

a gate electrode of the third transistor is connected to the first clock signal terminal, a first electrode of the third transistor is connected to the first signal terminal, and a second electrode of the third transistor is connected to the second node.

Optionally, the first control unit includes a fourth transistor, a fifth transistor, a sixth transistor, a first capacitor, and a second capacitor;

a gate electrode of the fourth transistor is connected to the second node, a first electrode of the fourth transistor is connected to the second clock signal terminal, and a second electrode of the fourth transistor is connected to a fifth node;

a gate electrode of the fifth transistor is connected to the second clock signal terminal, a first electrode of the fifth transistor is connected to the fifth node, and a second electrode of the fifth transistor is connected to the third node;

a first electrode of the first capacitor is connected to the second node, and a second electrode of the first capacitor is connected to the fifth node;

a first electrode of the second capacitor is connected to the third node, and a second electrode of the second capacitor is connected to the second signal terminal;

a first electrode of the sixth transistor is connected to the second signal terminal, a second electrode of the sixth transistor is connected to the third node, and a gate electrode of the sixth transistor is connected to the first node or the fourth node.

Optionally, the output unit includes a seventh transistor and an eighth transistor;

a gate electrode of the seventh transistor is connected to the third node, a first electrode of the seventh transistor is connected to the second signal terminal, and a second electrode of the seventh transistor is connected to an output terminal;

a gate electrode of the eighth transistor is connected to the fourth node, a first electrode of the eighth transistor is connected to the first signal terminal, and a second electrode of the eighth transistor is connected to the output terminal.

Optionally, the shift register of at least one embodiment of the present disclosure further includes a second control unit and a voltage stabilizing unit;

the second control unit is used for writing the voltage signal of the first node to a sixth node or writing the second signal provided by the second signal terminal to the sixth node under control of the second clock signal and the electrical potential of the second node;

the voltage stabilizing unit is used for stabilizing a voltage signal of the fourth node.

Optionally, the second control unit includes a ninth transistor and a tenth transistor, and the voltage stabilizing unit includes a voltage stabilizing capacitor;

a gate electrode of the tenth transistor is connected to the second node, a first electrode of the tenth transistor is connected to the second signal terminal, and a second electrode of the tenth transistor is connected to the sixth node;

a gate electrode of the ninth transistor is connected to the second clock signal terminal, a first electrode of the ninth transistor is connected to the first node, and a second electrode of the ninth transistor is connected to the sixth node; or a gate electrode of the ninth transistor is connected to the first node, a first electrode of the ninth transistor is connected to the second clock signal terminal, and a second electrode of the ninth transistor is connected to the sixth node;

a first electrode plate of the voltage stabilizing capacitor is connected to the fourth node, and a second electrode plate of the voltage stabilizing capacitor is connected to an output terminal or a third signal terminal.

In a second aspect, an embodiment of the present disclosure provides a drive method for driving the shift register described above, the drive method including:

providing, by an input unit, a starting signal inputted via a signal input terminal to a first node and providing, by the input unit, a first signal inputted via a first signal terminal to a second node;

providing, by a first control unit under control of an electrical potential of the second node and a second clock signal provided by a second clock signal terminal, the second clock signal to a third node;

providing, by an isolation unit under control of the third node, a voltage signal of the first node to a fourth node; and providing, by an output unit under control of the fourth node and the third node, output based on the first signal or a second signal provided by a second signal terminal.

In a third aspect, an embodiment of the present disclosure provides a drive circuit, including: a plurality of the above-mentioned shift registers in cascade, the shift register in a first row is connected to a signal input terminal, a first clock signal terminal, a second clock signal terminal, a first signal terminal, a second signal terminal, and a signal input terminal of the shift register in a second row;

the shift register in a (n+1)-th row is electrically connected to the signal input terminal, the first clock signal terminal, the second clock signal terminal, the first signal terminal, and the second signal terminal of the shift register in a n-th row, and an output terminal of the shift register in the n-th row, n being a positive integer greater than 1.

In a fourth aspect, an embodiment of the present disclosure provides a display panel, including the shift register described above, and the display panel further including:

a substrate;

a semiconductor layer provided on one side of the substrate, the semiconductor layer including an active pattern of an isolation unit;

a second insulating layer provided on a side of the semiconductor layer away from the substrate;

a first metal layer provided on a side of the second insulating layer away from the semiconductor layer, wherein the first metal layer includes a first gate pattern of the isolation unit, a first gate pattern of an output unit, and a second gate pattern of the output unit, and the second gate pattern of the output unit is connected to the first gate pattern of the isolation unit;

a third insulating layer provided on a side of the first metal layer away from the second insulating layer;

a second metal layer provided on a side of the third insulating layer away from the first metal layer;

a fourth insulating layer provided on a side of the second metal layer away from the third insulating layer, wherein the fourth insulating layer is provided with a first via hole, a second via hole, and a third via hole; the first via hole and the second via hole are both used for exposing the active pattern of the isolation unit, and the third via hole is used for exposing the first gate pattern of the output unit; and a third metal layer provided on a side of the fourth insulating layer away from the second metal layer, wherein the third metal layer includes a first metal strip and a second metal strip; the first metal strip is connected to the active pattern of the isolation unit through the first via hole; a first end of the second metal strip is connected to the active pattern of the isolation unit through the second via hole, and a second end of the second metal strip is connected to the first gate pattern of the output unit through the third via hole.

Optionally, the semiconductor layer provided on the one side of the substrate includes:

a first shielding layer provided on the one side of the substrate;

a first insulating layer provided on a side of the first shielding layer away from the substrate; and an oxide semiconductor layer provided on a side of the first insulating layer away from the first shielding layer, the oxide semiconductor layer including the active pattern of the isolation unit.

In a fifth aspect, an embodiment of the present disclosure provides a method for preparing the above-mentioned display panel, including:

forming a semiconductor layer on a substrate, the semiconductor layer including an active pattern of an isolation unit;

forming a second insulating layer on a side of the semiconductor layer away from the substrate;

forming a first metal layer on a side of the second insulating layer away from the semiconductor layer, wherein the first metal layer includes a first gate pattern of the isolation unit, a first gate pattern of an output unit, and a second gate pattern of the output unit, and the second gate pattern of the output unit is connected to the first gate pattern of the isolation unit;

forming a third insulating layer on a side of the first metal layer away from the second insulating layer;

forming a second metal layer on a side of the third insulating layer away from the first metal layer;

forming a fourth insulating layer on a side of the second metal layer away from the third insulating layer, wherein the fourth insulating layer is provided with a first via hole, a second via hole, and a third via hole; the first via hole and the second via hole are both used for exposing the active pattern of the isolation unit, and the third via hole is used for exposing the first gate pattern of the output unit; and forming a third metal layer on a side of the fourth insulating layer away from the second metal layer, wherein the third metal layer includes a first metal strip and a second metal strip; the first metal strip is connected to the active pattern of the isolation unit through the first via hole; a first end of the second metal strip is connected to the active pattern of the isolation unit through the second via hole, and a second end of the second metal strip is connected to the first gate pattern of the output unit through the third via hole.

Optionally, the forming the semiconductor layer on the substrate includes:

forming a first shielding layer on one side of the substrate;

forming a first insulating layer on a side of the first shielding layer away from the substrate; and

5

6 forming an oxide semiconductor layer on a side of the first insulating layer away from the first shielding layer, the oxide semiconductor layer including the active pattern of the isolation unit.

In a sixth aspect, an embodiment of the present disclosure provides a display apparatus, including the display panel described above.

BRIEF DESCRIPTION OF THE DRAWINGS

The accompanying drawings, which are incorporated in and constitute a part of this specification, illustrate embodiments consistent with the disclosure and, together with the description, serve to explain the principles of the disclosure.

In order to explain the embodiments of the present disclosure or the technical solutions in the related art more clearly, the drawings used in the embodiments or the description of the related art will be described briefly, and it would be obvious that a person skilled in the art can obtain other drawings according to these drawings without involving any creative effort.

FIG. 5 is a drive timing diagram of a shift register according to an embodiment of the present disclosure;

FIG. 6 is a flow chart illustrating the steps of a drive method for driving a shift register according to an embodiment of the present disclosure;

FIG. 7 is a flow chart illustrating the steps of a method for preparing a display panel according to an embodiment of the present disclosure;

DETAILED DESCRIPTION

In order that the objects, aspects and advantages of the embodiments of the present disclosure will become more apparent, technical solutions in embodiments of the present disclosure will be described in a clear and thorough manner hereinafter with reference to the drawings related to the embodiments. Obviously, the described embodiments are merely a part of, rather than all of, the embodiments of the present disclosure. Based on the embodiments of the present disclosure, a person skilled in the art may, without any creative effort, obtain other embodiments, which also fall within the scope of the present disclosure.

Figure 1:
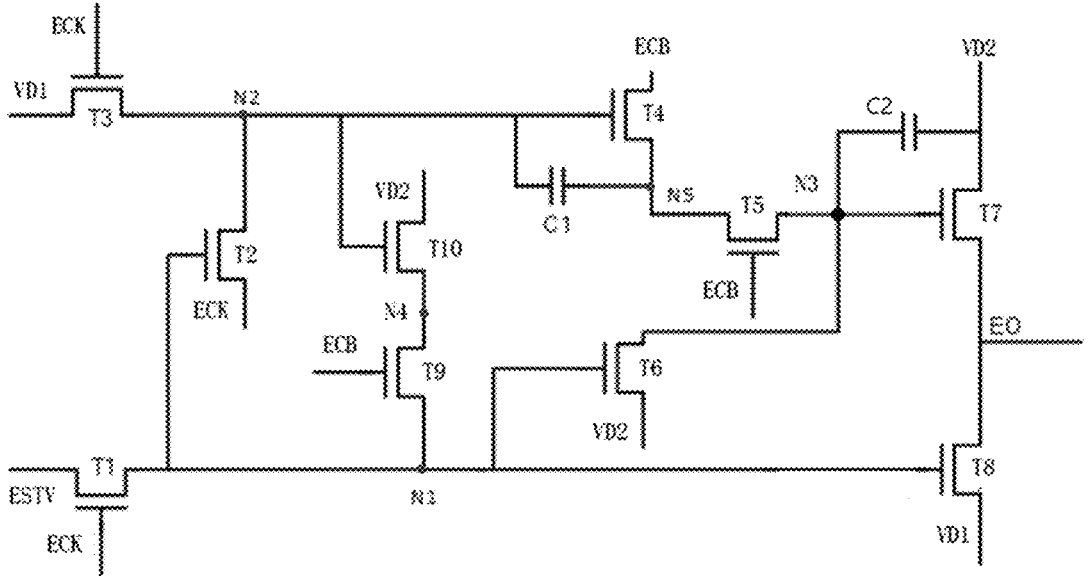
FIG. 1 is a schematic structural diagram of a circuit of a shift register in the related art.

Conventionally, GOA, such as all-oxide EM GOA, has the risk of outputting floating for a long time when it outputs high electrical level. Specifically, according to timing, the conventional all-oxide EM GOA is required to output a valid voltage signal for a long time within one frame. In order to achieve this object, since the thin film transistors (TFTs) in the all-oxide EM GOA (the EM GOA may be a GOA for providing a light-emitting control signal) are all N-type metal-oxide semiconductor (NMOS) transistors, the gate voltage of a buffer transistor (the buffer transistor can be an eighth transistor T8 as shown in FIG. 1) corresponding to the output of the all-oxide EM GOA needs to be maintained at a voltage value higher than Vgh+Vth8 (where Vgh is a high voltage value and Vth8 is a threshold voltage of T8). If the gate voltage of the buffer transistor is lower than Vgh+Vth8 for a long time, then the EM GOA outputs a Floating state for a long time, and there is a greater risk of output NG. However, in a conventional EM GOA circuit, as shown in FIG. 1, the tenth transistor T10 and the ninth transistor T9 periodically discharge the first node N1, that is, periodically writing a low electrical potential to the first node N1; even if the electrical potential of the first node N1 may be compensated somewhat by turning on the first transistor T1 during the on-phase of the first clock signal terminal ECK when the electrical potential of the first node N1 is low, the stable voltage value written to the first node N1 is Vgh−Vth8 due to the write characteristic of the NMOS transistor, which is still lower than the voltage value required to completely write a high electrical level to the buffer transistor, that is, the voltage value of the first node N1 is still lower than the gate voltage value required for turning on the eighth transistor T8, and the eighth transistor T8 cannot be turned on, resulting in that the output terminal EO is in a Floating state for a long time, and resulting in a greater risk of outputting Floating.

In FIG. 1, label T1 denotes a first transistor, label T2 denotes a second transistor, label T3 denotes a third transistor, label T4 denotes a fourth transistor, label T5 denotes a fifth transistor, label T6 denotes a sixth transistor, label T7 denotes a seventh transistor, label T8 denotes an eighth transistor, label T9 denotes a ninth transistor, label T10 denotes a tenth transistor, label C1 denotes a first capacitor, label C2 denotes a second capacitor, label N1 denotes a first node, and label N2 denotes a second node. Label ECK denotes a first clock signal terminal, label ECB denotes a second clock signal terminal, label ESTV denotes a signal input terminal, label VD1 denotes a first signal terminal, label VD2 denotes a second signal terminal, label N3 denotes a third node, label N4 denotes a fourth node, and label N5 denotes a fifth node.

One of the core concepts of the embodiments of the present disclosure is to provide a novel shift register, in which the first node N1 in FIG. 1 is split, so that the voltage signal of the first node N1 is no longer the gate control signal of the eighth transistor T8, and a new node and an isolation unit are introduced, so that the discharging of the first node N1 by the tenth transistor T10 and the ninth transistor T9 does not affect the gate voltage of the eighth transistor T8, thereby greatly reducing the risk of outputting Floating for a long time.

In order to facilitate an understanding of the embodiments of the present disclosure, further descriptions will be made with reference to the accompanying drawings and specific examples, which are not to be construed as limiting the embodiments of the present disclosure.

Figure 2:
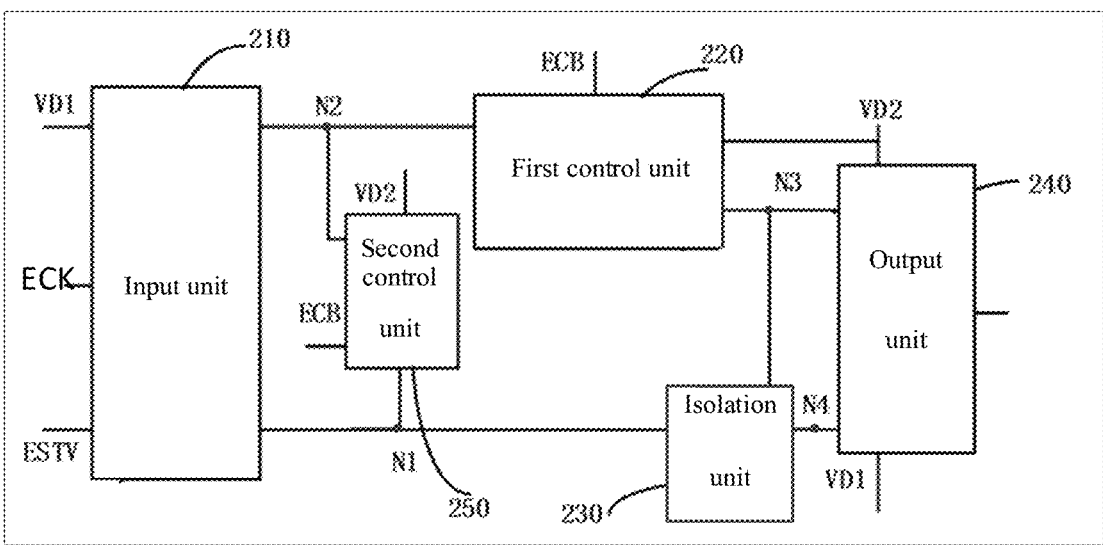
FIG. 2 is a schematic structural diagram of a shift register according to an embodiment of the present disclosure.

FIG. 2 is a schematic structural diagram of a shift register according to an embodiment of the present disclosure. As shown in FIG. 2, the shift register according to the embodiment of the present disclosure may specifically include: an input unit 210, a first control unit 220, an isolation unit 230, and an output unit 240. The input unit 210 is used for providing a starting signal inputted via the signal input terminal ESTV to the first node N1, for example: under control of a first clock signal provided by a first clock signal terminal ECK, providing a starting signal inputted via the signal input terminal ESTV to the first node N1; the input unit 210 can also be used for providing the first signal inputted via the first signal terminal VD1 to the second node N2, for example: under control of a first clock signal provided by a first clock signal terminal ECK, providing a first signal inputted via a first signal terminal VD1 to a second node N2; or, under control of a second clock signal provided by the second clock signal terminal ECB, providing the first signal inputted via the first signal terminal VD1 to the second node N2, wherein the first signal provided by the first signal terminal VD1 can be a high electrical level signal VGH or a low electrical level signal VGL. The first control unit 220 is used for providing the second clock signal written by the second clock signal terminal ECB to the third node under control of the electrical potential of the second node N2 and the second clock signal provided by the second clock signal terminal ECB; the isolation unit 230 is used for providing the voltage signal of the first node N1 to the fourth node N4; the output unit 240 is used for, under control of the electrical potential of the fourth node N4 and the electrical potential of the third node N3, providing output based on the first signal inputted via the first signal terminal VD1 or the second signal inputted via the second signal terminal VD2.

In at least one embodiment of the present disclosure, that the output unit 240, under control of the electrical potential of the fourth node N4 and the electrical potential of the third node N3, provides output based on the first signal inputted via the first signal terminal VD1 or the second signal inputted via the second signal terminal VD2 may refer to:

under control of the electrical potential of the fourth node N4 and the electrical potential of the third node N3, the output unit 240 controls a connection between the output terminal EO and the first signal terminal VD1 or the second signal terminal VD2 to be switched on.

Specifically, the input unit 210 in the embodiment of the present disclosure can provide the starting signal inputted via the signal input terminal ESTV to the first node N1 and provide the first signal inputted via the first signal terminal VD1 to the second node N2 under control of the first clock signal provided by the first clock signal terminal ECK, so that under control of the electrical potential of the second node N2 and the second clock signal provided by the second clock signal terminal ECB, the first control unit 220 can provide the second clock signal provided by the second clock signal terminal ECB to the third node N3. Thus, the isolation unit 230 can provide the voltage signal of the first node N1 to the fourth node N4 under control of the electrical potential of the third node N3, so that the output unit 240 can provide output based on the first signal inputted via the first signal terminal VD1 or the second signal inputted via the second signal terminal VD2 under control of the electrical potential of the third node N3 and the electrical potential of the fourth node N4, thereby greatly reducing the risk of outputting Floating.

It can be seen that in the embodiment of the present disclosure, the input unit 210 provides the starting signal inputted via the signal input terminal ESTV to the first node N1 and provides the first signal inputted via the first signal terminal VD1 to the second node N2, so that under control of the electrical potential of the second node N2 and the second clock signal provided by the second clock signal terminal ECB, the first control unit 220 can provide the second clock signal provided by the second clock signal terminal ECB to the third node N3, so that the isolation unit 230 provides the voltage signal of the first node N1 to the fourth node N4 under control of the electrical potential of the third node N3, thus the output unit 240 can provide output based on the first signal inputted via the first signal terminal VD1 or the second signal inputted via the second signal terminal VD2 under control of the electrical potential of the fourth node N4 and the electrical potential of the third node N3, thereby greatly reducing the risk of outputting Floating for a long time and improving output stability.

Figure 3:
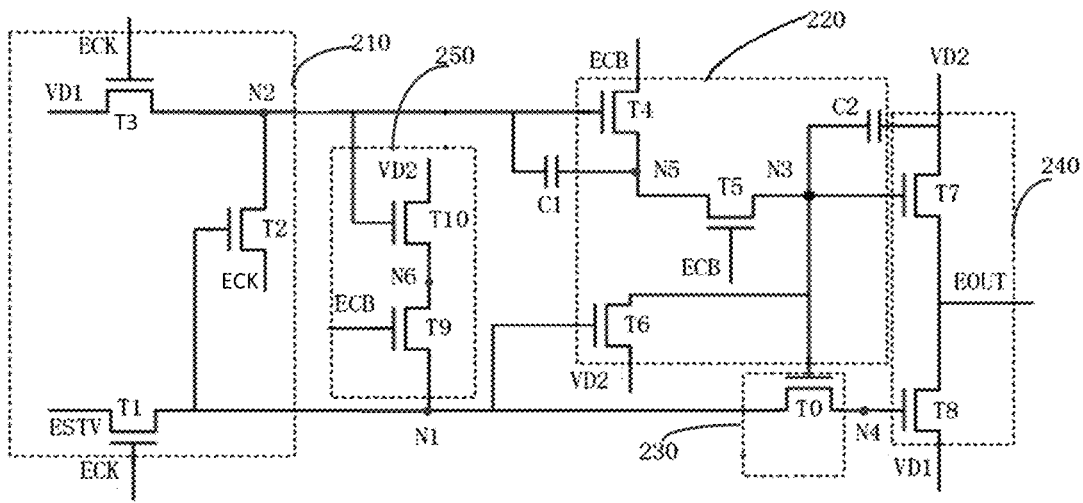
FIG. 3 is a schematic structural diagram of a circuit of a shift register according to an optional embodiment of the present disclosure.

Optionally, the isolation unit 230 in the embodiment of the present disclosure may specifically include a separator transistor T0. As shown in FIG. 3, the gate electrode of the separator transistor T0 is connected to the third node N3, the first electrode of the separator transistor is connected to the first node N1, and the second electrode of the separator transistor T0 is connected to the fourth node N4. The separator transistor T0 is used for providing the voltage signal of the first node N1 to the fourth node N4 under control of the electrical potential of the third node N3, so that under control of the electrical potential of the fourth node N4 and the electrical potential of the third node N3, the output unit 240 can provide, via the output terminal EO, output based on the first signal inputted via the first signal terminal VD1 or the second signal inputted via the second signal terminal VD2, thereby greatly reducing the risk of outputting Floating for a long time and improving the output stability.

Optionally, on the basis of the above-mentioned embodiment, the input unit 210 in an embodiment of the present disclosure may specifically include: a first transistor T1, a second transistor T2 and a third transistor T3. As shown in FIG. 3, the gate electrode of the first transistor T1 is connected to the first clock signal terminal ECK, the first electrode of the first transistor T1 is connected to the signal input terminal ESTV, and the second electrode of the first transistor T1 is connected to the first node N1, so that the first transistor T1 can provide the starting signal inputted via the signal input terminal ESTV to the first node N1 under control of the first clock signal provided by the first clock signal terminal ECK. The gate electrode of the second transistor T2 is connected to the first node N1, the first electrode of the second transistor T2 is connected to the first clock signal terminal ECK, and the second electrode of the second transistor T2 is connected to the second node N2, so that under control of the electrical potential of the first node N1, the second transistor T2 can provide the first clock signal provided by the first clock signal terminal ECK to the second node N2. The gate electrode of the third transistor T3 is connected to the first clock signal terminal ECK, the first electrode of the third transistor T3 is connected to the first signal terminal VD1, and the second electrode of the third transistor T3 is connected to the second node N2, so that under control of the first clock signal provided by the first clock signal terminal ECK, the third transistor T3 can provide the first signal written via the first signal terminal VD1 to the second node N2.

In a specific implementation, optionally, the first control unit 220 in an embodiment of the present disclosure may specifically include: a fourth transistor T4, a fifth transistor T5, a sixth transistor T6, a first capacitor C1 and a second capacitor C2.

In an optional implementation, as shown in FIG. 3, the gate electrode of the fourth transistor T4 is connected to the second node N2, the first electrode of the fourth transistor T4 is connected to the second clock signal terminal ECB, and the second electrode of the fourth transistor T4 is connected to the fifth node N5, so that under control of the electrical potential of the second node N2, the fourth transistor T4 can provide the second clock signal provided by the second clock signal terminal ECB to the fifth node N5. The gate electrode of the fifth transistor T5 is connected to the second clock signal terminal ECB, the first electrode of the fifth transistor T5 is connected to the fifth node N5, and the second electrode of the fifth transistor T5 is connected to the third node N3, so that the fifth transistor can provide the voltage signal of the fifth node N5 to the third node N3 under control of the second clock signal provided by the second clock signal terminal ECB. A first electrode of the sixth transistor T6 is connected to the second signal terminal VD2, a second electrode of the sixth transistor T6 is connected to the third node N3, and a gate electrode of the sixth transistor T6 is connected to the first node N1, so that under control of the electrical potential of the first node N1, the sixth transistor T6 can provide the second signal inputted via the second signal terminal VD2 to the third node N3. The first electrode plate of the first capacitor C1 is connected to the second node N2, and the second electrode plate of the first capacitor C1 is connected to the fifth node N5. The first capacitor C1 can be used for storing charges, and when the second node N2 is in a Floating state, the first capacitor C1 undergoes coupled discharge so as to turn on the fourth transistor T4, so that a voltage level corresponding to the second clock signal can completely written to N5, and the fifth transistor can provide the voltage signal of the fifth node N5 to the third node N3 under control of the second clock signal provided by the second clock signal terminal ECB, thereby ensuring the stability of the output. The first electrode plate of the second capacitor C2 is connected to the third node N3, and the second electrode plate of the second capacitor C2 can be connected to the second signal terminal VD2, and the embodiments of the present disclosure are not specifically limited thereto.

Of course, in embodiments of the present disclosure, besides being connected to the first node N1, the gate electrode of the sixth transistor T6 may be connected in other manners, for example, the gate electrode of the sixth transistor T6 may be connected to the fourth node, and the embodiment of the present disclosure is not particularly limited thereto.

Figure 4:
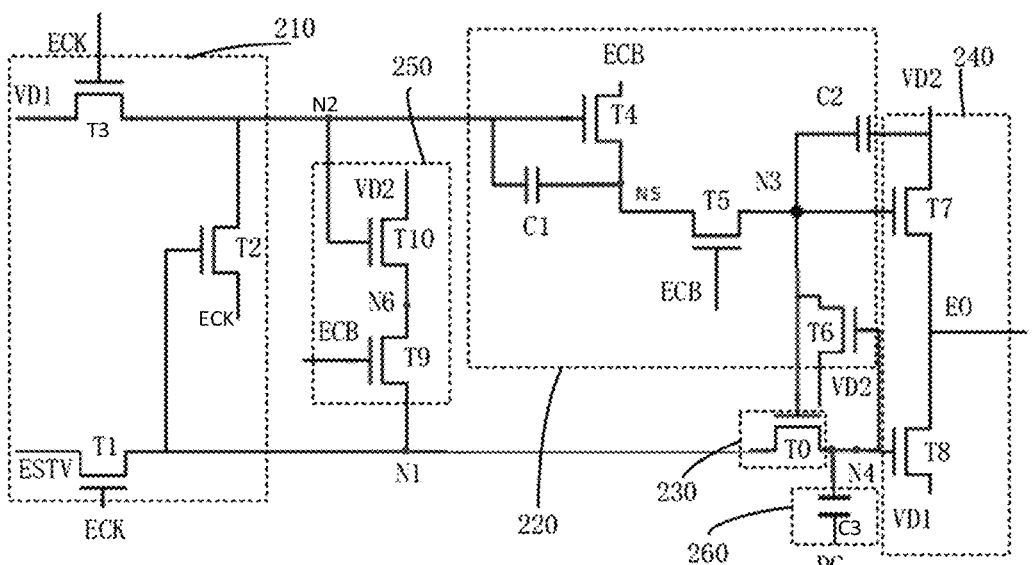
FIG. 4 is a schematic structural diagram of a circuit of a shift register according to another optional embodiment of the present disclosure.

In another optional implementation, in the first control unit 220, the gate electrode of the sixth transistor T6 may be connected to the fourth node N4, as shown in FIG. 4. The sixth transistor T6 can be used for providing, under control of the electrical potential of the fourth node N4, the second signal inputted via the second signal terminal VD2 to the third node N3, thereby ensuring the stability of the output.

In an optional implementation, the output unit 240 in an embodiment of the present disclosure may specifically include: a seventh transistor T7 and an eighth transistor T8. As shown in FIG. 3 or FIG. 4, the gate electrode of the seventh transistor T7 is connected to the third node N3, the first electrode of the seventh transistor T7 is connected to the second signal terminal VD2, and the second electrode of the seventh transistor T7 is connected to the output terminal EO, so that the seventh transistor T7 can provide, under control of the electrical potential of the third node N3, the second signal inputted via the second signal terminal VD2 to the output terminal EO, thereby ensuring the stability of the output; the gate electrode of the eighth transistor T8 is connected to the fourth node N4, the first electrode of the eighth transistor T8 is connected to the first signal terminal VD1, and the second electrode of the eighth transistor T8 is connected to the output terminal EO, so that the eighth transistor T8 can be used for providing, under control of the electrical potential of the fourth node N4, the first signal inputted via the first signal terminal VD1 to the output terminal, thereby ensuring the stability of the output.

In a specific implementation, the first control input terminal of the first control unit 220 in the embodiment of the present disclosure may be connected to the second node N2, so as to provide, under control of the electrical potential of the second node N2, the second clock signal inputted via the second clock signal terminal ECB to the third node N3, so that the output unit 240 may output, under control of the electrical potential of the third node N3, the target signal based on the second signal inputted via the second signal terminal VD2, and the isolation unit 230 may provide, under control of the electrical potential of the third node, the voltage signal of the first node N1 to the fourth node N4, thus the output unit 240 can output, under control of the electrical potential of the third node and the electrical potential of the fourth node N4, the target signal based on the first signal inputted via the first signal terminal VD1 to ensure the stability of the output. Here, the target signal is a signal that the shift register needs to output.

Optionally, the shift register in the embodiment of the present disclosure may further include the second control unit 250. The second control unit 250 may be used for writing the voltage signal of the first node N1 to the sixth node N6 or writing the second signal of the second signal terminal VD2 to the sixth node N6.

In an optional implementation, the second control unit 250 may be used for, under control of the second clock signal provided at the second clock signal terminal ECB and the electrical potential of the second node N2, writing the voltage signal of the first node N1 to the sixth node N6 or writing the second signal inputted via the second signal terminal VD2 to the sixth node N6. For example, the second control unit 250 can write the second signal provided by the second signal terminal VD2 to the sixth node N6 under control of the second clock signal provided by the second clock signal terminal ECB; as another example, the second control unit 250 may write the second signal provided by the second signal terminal VD2 to the sixth node N6 under control of the second clock signal provided by the second clock signal terminal ECB and the electrical potential of the second node N2.

In another optional implementation, the second control unit 250 may be used for providing a second clock signal provided by the second clock signal terminal ECB to the sixth node N6 or writing a second signal provided by the second signal terminal VD2 to the sixth node N6 under control of the electrical potential of the first node N1 and the electrical potential of the second node N2. For example, the second control unit 250 may provide the second clock signal provided by the second clock signal terminal ECB to the sixth node N6 under control of the electrical potential of the first node N1; as another example, the second control unit 250 may write the second signal provided by the second signal terminal VD2 to the sixth node N6 under control of the electrical potential of the second node N2.

In an optional implementation, the second control unit 250 in an embodiment of the present disclosure may specifically include: a ninth transistor T9 and a tenth transistor T10. As shown in FIG. 3 or FIG. 4, a gate electrode of a tenth transistor T10 is connected to a second node N2, a first electrode of the tenth transistor T10 is connected to the second signal terminal VD2, and a second electrode of the tenth transistor T10 is connected to a sixth node N6, so that the tenth transistor T10 can provide a second signal inputted via the second signal terminal VD2 to the sixth node N6 under control of the electrical potential of the second node N2; the gate electrode of the ninth transistor T9 is connected to the second clock signal terminal ECB, the first electrode of the ninth transistor T9 is connected to the first node N1, and the second electrode of the ninth transistor T9 is connected to the sixth node N6, so that the ninth transistor T9 can provide the voltage signal of the first node N1 to the sixth node N6 under control of the second clock signal provided by the second clock signal terminal ECB.

In an optional implementation, the second control unit 250 in an embodiment of the present disclosure may specifically include: a ninth transistor T9 and a tenth transistor T10. The implementation differs from FIGS. 3 and 4 in the connection manner of the ninth transistor T9. The gate electrode of the tenth transistor T10 is connected to the second node N2, the first electrode of the tenth transistor T10 is connected to the second signal terminal VD2, and the second electrode of the tenth transistor T10 is connected to the sixth node N6, so that the tenth transistor T10 can provide the second signal inputted via the second signal terminal VD2 to the sixth node N6 under control of the electrical potential of the second node N2; the gate electrode of the ninth transistor T9 is connected to the first node N1, the first electrode of the ninth transistor T9 is connected to the second clock signal terminal ECB, and the second electrode of the ninth transistor T9 is connected to the sixth node N6, so that the ninth transistor T9, under control of the electrical potential of the first node N1, provides the second clock signal provided by the second clock signal terminal ECB to the sixth node N6, for example, the ninth transistor T9 provides the second clock signal provided by the second clock signal terminal ECB to the sixth node N6 under control of the voltage signal of the first node N1.

It should be noted that the transistors used in the embodiments of the present disclosure may be thin film transistors or field effect transistors or other devices having the same characteristics. In the embodiments of the present disclosure, the connection manners of the drain electrode and the source electrode of each transistor can be interchanged; therefore, there is no essential distinction between the drain electrode and the source electrode of each transistor in the embodiments of the present disclosure. Here, only in order to distinguish two electrodes of the transistor other than the gate electrode, one of the two electrodes is referred to as a first electrode, and the other electrode is referred to as a second electrode, wherein the first electrode can be a source electrode or a drain electrode, and the second electrode can be a drain electrode or a source electrode. The thin film transistor used in the embodiments of the present disclosure may be an N-type transistor or a P-type transistor, and the embodiments of the present disclosure are not specifically limited in this regard.

In the embodiment of the present disclosure, when an N-type thin film transistor is used, the first electrode thereof may be a drain electrode and the second electrode thereof may be a source electrode. In the following embodiments, the description is made by taking the thin film transistor as an N-type transistor, i.e. when the gate signal is high, the thin film transistor is turned on. It will be appreciated that when P-type transistors are used, the timing of the drive signals needs to be adjusted accordingly.

As an example of an embodiment of the present disclosure, in the case of using N-type thin film transistors to realize a shift register, as shown in FIG. 3, a first transistor T1, a second transistor T2, a third transistor T3, a fourth transistor T4, a fifth transistor T5, a sixth transistor T6, a seventh transistor T7, an eighth transistor T8, a ninth transistor T9 and a tenth transistor T10 in the shift register are all N-type thin film transistors; a first signal terminal VD1 can be a first power terminal, and a second signal terminal VD2 can be a second power terminal; the first signal inputted via the first signal terminal VD1 may be a high electrical level signal VGH provided by the first power terminal, and the second signal inputted via the second signal terminal VD2 may be a low electrical level signal VGL provided by the second power terminal.

For example, in a first stage t1, as shown in FIG. 5, a starting signal STV provided by a signal input terminal ESTV is a low electrical level signal VGL, a first clock signal CK provided by a first clock signal terminal ECK is a high electrical level signal VGH, a second clock signal CB provided by a second clock signal terminal ECB is a low electrical level signal VGL, the first clock signal CK is a high electrical level signal VGH, a first transistor T1 and a third transistor T3 are both on, the second clock signal CB is a low electrical level signal VGL, and a ninth transistor T9 is off; the turned-on first transistor T1 can provide a starting signal STV inputted via a signal input terminal ESTV to a first node N1, so that a low electrical level signal VGL is written to the first node N1, and a second transistor T2 and a sixth transistor T6 are turned off; the turned-on third transistor T3 can provide a first signal provided by a first signal terminal VD1 to a second node N2, so that the electrical potential of the second node N2 is Vgh−Vth3 (Vgh is a voltage value of a high electrical level signal VGH, and Vth3 is a threshold voltage of T3), and a tenth transistor T10 is turned on to provide the second signal provided by the second signal terminal VD2 to the sixth node N6, so that the low electrical level signal VGL is written to the sixth node N6, and the fourth transistor T4 is turned on, so that the second clock signal CB provided by the second clock signal terminal ECB can be provided to the fifth node N5, so that the low electrical level signal VGL is written to the fifth node N5, the fifth transistor T5 is turned off, the third node N3 is in a Floating state and is in a state corresponding to the low electrical level signal VGL, and the seventh transistor T7 and the separator transistor T0 are turned off; the fourth node N4 is in a Floating state and is in a state corresponding to the high electrical level signal VGH; the eighth transistor T8 is turned on; and the first signal inputted via the first signal terminal VD1 is provided to the output terminal EO via the turned-on eighth transistor T8, so that the output terminal EO outputs the high electrical level signal as the target signal.

In a second stage t2, the starting signal STV provided by the signal input terminal ESTV is a low electrical level signal VGL, the first clock signal CK provided by the first clock signal terminal ECK is a low electrical level signal VGL, the second clock signal CB provided by the second clock signal terminal ECB is a high electrical level signal VGH, the first clock signal CK is a low electrical level signal VGL, the first transistor T1 and the third transistor T3 are both off, the tenth transistor T10 remains on, and a second signal inputted via the second signal terminal VD2 is provided to the sixth node N6 via the tenth transistor T10, so that a low electrical level signal VGL is written to the sixth node N6; and the second clock signal CB is a high electrical level signal VGH, the ninth transistor T9 is turned on, so that the low electrical level signal VGL is written to the first node N1, the second transistor T2 is turned off, and the fourth transistor T4 remains in an on state, thus the second clock signal CB provided by the second clock signal terminal ECB can be provided to the fifth node N5 via the fourth transistor T4, and the electrical potential of the fifth node N5 becomes Vgh–Vth3–Vth4, wherein Vth4 is a threshold voltage of T4; then through the coupling of the first capacitor C1, the voltage value of the second node N2 can be further increased, for example, the voltage value of the second node N2 can be further increased beyond the voltage value Vgh of the high electrical level signal VGH, so that the fifth node N5 can be completely written with the high electrical level signal VGH; the second clock signal CB is the high electrical level signal VGH, the fifth transistor T5 is turned on, therefore the fifth transistor T5 can provide the high electrical level signal VGH of the fifth node N5 to the third node N3, so as to write the voltage value of Vgh–Vth5 to the third node N3, wherein the Vth5 is a threshold voltage of T5; the separator transistor T0 is turned on, so that the voltage signal of the first node N1 can be provided to the fourth node N4 via the turned-on separator transistor T0, and the low voltage signal VGL is written to the fourth node N4; the eighth transistor T8 is turned off, and the seventh transistor T7 is turned on, thus the turned-on seventh transistor T7 can provide the second signal inputted via the second signal terminal VD2 to the output terminal EO, so that the output terminal EO outputs the low electrical level signal VGL as the target signal.

In a third stage t3, the starting signal STV provided by the signal input terminal ESTV is a low electrical level signal VGL, the first clock signal CK provided by the first clock signal terminal ECK is a high electrical level signal VGH, the second clock signal CB provided by the second clock signal terminal ECB is a low electrical level signal VGL, the first transistor T1 and the third transistor T3 are turned on, the ninth transistor T9 is turned off, and the starting signal STV provided by the signal input terminal ESTV can be provided to the first node N1 via the turned-on first transistor T1, so that the low electrical level signal VGL is written to the first node N1, the second transistor T2 and the sixth transistor T6 are turned off; and the turned-on third transistor T3 can provide the first signal provided by the first signal terminal VD1 to the second node N2, so that the fourth transistor T4 and the tenth transistor T10 are turned-on, thus the second clock signal CB provided by the second clock signal terminal ECB can be provided to the fifth node N5 via the fourth transistor T4, the low electrical level signal VGL is written to the fifth node N5; the second clock signal CB is the low electrical level signal VGL, the fifth transistor T5 is turned off, the third node is in Floating state and maintains the state of the second stage, i.e., written with partial voltage Vgh–Vth5, the separator transistor T0 is turned on, so that the voltage signal of the first node N1 can be provided to the fourth node N4 via the separator transistor T0, and the low electrical level signal VGL is written to the fourth node N4; the eighth transistor T8 is turned off, and the seventh transistor T7 is turned on, so that the second signal of the second signal terminal VD2 can be provided to the output terminal EO via the seventh transistor T7, thus the EO outputs the low electrical level signal VGL as the target signal.

In a fourth stage t4, the starting signal STV provided by the signal input terminal ESTV is a high electrical level signal VGH, the first clock signal CK provided by the first clock signal terminal ECK is a low electrical level signal VGL, the second clock signal CB provided by the second clock signal terminal ECB is a high electrical level signal VGH, the first transistor T1 and the third transistor T3 are off, and the tenth transistor T10 and the fourth transistor T4 remain on, so that a second signal inputted via the second signal terminal VD2 can be provided to the sixth node N6 via the tenth transistor T10, so that a low electrical level signal VGL is written to the sixth node N6; the second clock signal CB is a high electrical level signal VGH, the ninth transistor T9 is turned-on, so that the low electrical level signal VGL can be written to the first node N1 via the ninth transistor T9, the second transistor T2 and the sixth transistor T6 are turned off; through the fourth transistor T4, the electrical potential of the fifth node N5 becomes Vgh–Vth3–Vth4; through coupling of the first capacitor C1, the voltage value of the second node N2 can be further increased beyond the voltage value Vgh of the high electrical level signal VGH, and the fifth node N5 is completely written with the high electrical level signal VGH; the fifth transistor T5 is turned on, the electrical potential of the third node N3 is Vgh–Vth5, the separator transistor T0 is turned on; the voltage signal of the first node is provided to the fourth node N4 through the separator transistor T0, so that the low electrical level signal VGL is written to the fourth node N4; the eighth transistor T8 is turned off, the seventh transistor T7 is turned on, and the EO outputs the low electrical level signal VGL as the target signal.

In a fifth stage t5, the starting signal STV provided by the signal input terminal ESTV is a high electrical level signal VGH, the first clock signal CK provided by the first clock signal terminal ECK is a high electrical level signal VGH, the second clock signal CB provided by the second clock signal terminal ECB is a low electrical level signal VGL, the first transistor T1 and the third transistor T3 are turned on, the ninth transistor T9 is turned off, and through the turned-on first transistor T1, the electrical potential of the first node N1 is Vgh–Vth1, wherein Vth1 is a threshold voltage of T1; the second transistor T2 and the sixth transistor T6 are turned on, the third transistor T3 is turned on, the electrical potential of the second node N2 is Vgh–Vth3, the tenth transistor T10 and the fourth transistor T4 are turned on, so that a second signal inputted via the second signal terminal VD2 can be provided to the sixth node N6 via the tenth transistor T10, and the low electrical level signal VGL is written to the sixth node N6; through the fourth transistor T4, the low electrical level signal VGL is written to the fifth node N5, and the fifth transistor T5 is turned off; since the initial voltage of the third node N3 is the Vgh–Vth5 written in the fourth stage t4, in the process of writing the low electrical level signal VGL to the third node via the sixth transistor T6, the voltage signal of the first node N1 is partially written to the fourth node N4 through the separator transistor T0, so that the eighth transistor T8 is partially turned on, and through coupling of the gate-source capacitance Cgs of the eighth transistor T8, the voltage signal of the fourth node N4 is further increased beyond the high electrical level signal VGH, so that the high electrical level signal is completely written to the output terminal EO. When the voltage signal of the third node changes to the low electrical level signal VGL, the separator transistor T0 changes from the on state to the off state, and the seventh transistor T7 is turned off.

In a sixth stage t6, the starting signal STV provided by the signal input terminal ESTV is a high electrical level signal VGH, the first clock signal CK provided by the first clock signal terminal ECK is a low electrical level signal VGL, the second clock signal CB provided by the second clock signal terminal ECB is a high electrical level signal VGH, the first transistor T1 and the third transistor T3 are off, the ninth transistor T9 is on, and the first node N1 writes a certain voltage to the sixth node N6; because the first node N1 is not a gate electrode of the eighth transistor at this time, and the quantity of charges stored by the first node N1 is very limited, and cannot increase the voltage value of the sixth node N6 to Vgh–Vth9, wherein the Vth9 is a threshold voltage of T9; the second transistor T2 remains on, so that the first clock signal CK provided by the first clock signal terminal ECK can be provided to the second node N2 via the second transistor T2, so that the second node is written with the low electrical level signal VGL, the tenth transistor T10 and the fourth transistor T4 are off, the fifth node N5 floats and maintains the low electrical level signal VGL state of the fifth stage; the second clock signal CB is a high electrical level signal VGH, the fifth transistor T5 is turned on, and based on the voltage of the first node, the sixth transistor T6 is turned on, and a low electrical level signal VGL is written to the third node N3; the separator transistor T0 and the seventh transistor T7 are turned off, the fourth node N4 is in Floating state, and the voltage value of the fourth node exceeds the voltage value Vgh of the high electrical level signal VGH, the eighth transistor T8 is turned on, and the output terminal EO outputs the high electrical level signal VGH.

In a seventh stage t7, the starting signal STV provided by the signal input terminal ESTV is a high electrical level signal VGH, the first clock signal CK provided by the first clock signal terminal ECK is a high electrical level signal VGH, the second clock signal CB provided by the second clock signal terminal ECB is a low electrical level signal VGL, the first transistor T1 and the third transistor T3 are on, the electrical potential of the first node N1 is Vgh–Vth1, Vth1 is a threshold voltage of T1, the second transistor T2 is on, and the electrical potential of the second node N2 is Vgh–Vth3; the tenth transistor T10 is turned on, the second signal of the second signal terminal VD2 is provided to the sixth node N6 via the tenth transistor T10, so that the low electrical level signal VGL is written to the sixth node N6, the sixth transistor T6 is turned on, the low electrical level signal VGL is written to the third node N3, the separator transistor T0 and the seventh transistor T7 are turned off, the fourth node N4 is Floating, and the voltage value of the fourth node exceeds the voltage value Vgh of the high electrical level signal VGH, the eighth transistor T8 is turned on, and the output terminal EOUT outputs the high electrical level signal VGH.

Subsequently, the sixth stage and the seventh stage can be performed alternately at first, so that the second signal of the second signal terminal can always be written to the third node N3, the separator transistor T0 remains in the off state, the fourth node is in a high-voltage Floating state for a long time, and the eighth transistor T8 is turned on for a long time, thus the output terminal EOUT outputs a high electrical level signal VGH, thereby ensuring the stability of the output.

It can be seen that in the present example, by introducing the separator transistor T0 as an isolation unit, the voltage signal of the first node N1 is no longer the gate control signal of the eighth transistor T8, and the first node N1 is connected to the fourth node N4 (namely, the gate electrode of the eighth transistor T8) when the low electrical level signal VGL is output, and the first node N1 and the fourth node N4 are separated when the high electrical level signal VGH is output, so as to prevent the discharge path of the tenth transistor T10 and the ninth transistor T9 from affecting the gate voltage of the eighth transistor T8 when the high electrical level signal VGH is output. In addition, when the fourth node N4 continues Floating, the stable output of the high electrical level signal VGH is always maintained, and the retention rate of output voltage is good, which greatly reduces the risk of outputting Floating for a long time, solves the NG problem caused by the risk of outputting Floating for a long time in the existing all-oxide EM GOA when outputting a high electrical level, and improves the output stability.

Further, the embodiment of the present disclosure may introduce a voltage stabilizing unit of the electrical potential of the fourth node N4 and the voltage values of some signals, to further stabilize the voltage of the fourth node N4, which is not particularly limited by the embodiment of the present disclosure. The some signals specifically include, but are not limited to, a first signal, a second signal, a first clock signal CK, a second clock signal CB, an output signal provided by an output terminal EO, etc. and the embodiments of the present disclosure are not specifically limited thereto. For example, as shown in FIG. 4, a first terminal of the voltage stabilizing unit 260 can be connected to the fourth node N4, and a second terminal of the voltage stabilizing unit 260 is connected to a third signal terminal DC, so that the voltage stabilizing unit 260 can stabilize the voltage of the fourth node N4 based on the third signal of the third signal terminal DC, and reduce the risk of the fourth node N4 voltage being reduced in a frame due to the electric leakage of the fourth node N4 through the isolation unit.

Optionally, the voltage stabilizing unit 260 in the embodiment of the present disclosure may specifically include: a voltage stabilizing capacitor C3. As shown in FIG. 4, the first electrode of the voltage stabilizing capacitor C3 is connected to the fourth node N4, and the second electrode of the voltage stabilizing capacitor C3 is connected to the third signal terminal DC, so that the fourth node N4 stabilizes the gate voltage of the eighth transistor T8 under the action of the voltage stabilizing capacitor C3, thereby reducing the risk of the fourth node N4 voltage being reduced in a frame due to the electric leakage of the fourth node N4 through the separator transistor T0.

It can be seen that, by adding the voltage stabilizing capacitor C3 at the fourth node N4, the embodiment of the present disclosure can reduce the amount of voltage drop of the fourth node N4 in the case where the magnitude of electric leakage of the separator transistor T0 remains the same (i.e. in the case where the amount of charge loss is the same), thereby further reducing the risk of voltage drop of the fourth node N4. Here, the third signal terminal may be the output terminal EO of the shift register, or may be a direct current signal terminal, and the voltage value of the direct current signal terminal may be any one voltage value, which is not limited in the embodiments of the present disclosure.

In summary, in the shift register according to the embodiments of the present disclosure, the input unit provides a starting signal inputted via a signal input terminal ESTV to a first node N1 and provides a first signal inputted via a first signal terminal VD1 to a second node N2 under control of a first clock signal provided by a first clock signal terminal ECK, so that the first control unit can provide a second clock signal provided by a second clock signal terminal ECB to a third node N3 under control of the electrical potential of the second node N2 and a second clock signal provided by a second clock signal terminal ECB, thus the isolation unit can provide the voltage signal of the first node N1 to the fourth node N4 under control of the electrical potential of the third node N3, so that the fourth node N4 can maintain the voltage state corresponding to the first signal for a long time, and the output unit can, under control of the electrical potential of the fourth node N4 and the electrical potential of the third node N3, provide output based on the first signal inputted via the first signal terminal VD1 or the second signal inputted via the second signal terminal VD2, which greatly reduces the risk of outputting Floating, solves the output problem caused by the risk of outputting Floating for a long time in the existing all-oxide EM GOA when outputting a high electrical level, and improves the output stability.

In addition, on the basis of the isolation unit 230, the embodiment of the present disclosure further adds the voltage stabilizing unit 260 at the fourth node N4, which can avoid the situation where the voltage of the fourth node N4 decreases due to the electric leakage of the fourth node N4 through the separator transistor T0, which is caused by the limitations of the characteristics of the TFT itself, thereby further reducing the risk of voltage drop at the fourth node N4 on the basis that the isolation unit 230 prevents the voltage drop of the fourth node N4, and ensuring the stability of the output voltage.

Optionally, an embodiment of the present disclosure also provides a method for driving a shift register. The drive method for driving a shift register according to the embodiment of the present disclosure may be used to drive the shift register described in any one of the above embodiments. As shown in FIG. 6, the method for driving the shift register may specifically include the following steps:

step 610, providing, by the input unit, the starting signal inputted via a signal input terminal to the first node, and providing, by the input unit, the first signal inputted via the first signal terminal to the second node;

step 620, providing, by the first control unit under control of an electrical potential of the second node and the second clock signal provided by the second clock signal terminal, the second clock signal to the third node;

step 630, providing, by the isolation unit under control of an electrical potential of the third node, the voltage signal of the first node to the fourth node; and step 640, providing, by the output unit under control of an electrical potential of the fourth node and the electrical potential of the third node, output based on the first signal or the second signal inputted via the second signal terminal.

Optionally, in the method for driving a shift register according to an embodiment of the present disclosure, under control of a first clock signal terminal, an input unit provides a starting signal inputted via a signal input terminal to a first node and provides a first signal inputted via a first signal terminal to a second node; subsequently, under control of the electrical potential of the second node and the second clock signal, the first control unit can provide the second clock signal provided by the second clock signal terminal to the third node, so that the voltage signal of the first node can be provided to the fourth node by the isolation unit under control of the electrical potential of the third node, and then under control of the electrical potential of the fourth node and the electrical potential of the third node, the target signal can be outputted by the output unit based on the first signal or the second signal inputted via the second signal terminal, which greatly reduces the risk of outputting Floating and improves the output stability.

Optionally, an embodiment of the present disclosure also provides a drive circuit formed by shift registers. The drive circuit may specifically include: a plurality of cascaded shift registers as described in any one of the above embodiments; wherein the shift register in a first row is electrically connected to a signal input terminal ESTV, a first clock signal terminal ECK, a second clock signal terminal ECB, a first signal terminal VD1, a second signal terminal VD2, and a signal input terminal ESTV of the shift register in a second row; the shift register in the (n+1)-th row is electrically connected to the signal input terminal ESTV, the first clock signal terminal ECK, the second clock signal terminal ECB, the first signal terminal VD1, and the second signal terminal VD2 of the shift register in the n-th row and the output terminal of the shift register in the n-th row, wherein n is a positive integer greater than 1.

Optionally, an embodiment of the present disclosure also provides a display panel, which may specifically include the drive circuit formed by shift registers as described in any of the embodiments above. The display panel includes: a substrate; a semiconductor layer disposed on one side of the substrate, the semiconductor layer including an active pattern of the isolation unit; a second insulating layer disposed on a side of the semiconductor layer away from the substrate; a first metal layer provided on a side of the second insulating layer away from the semiconductor layer, wherein the first metal layer includes a first gate pattern of the isolation unit, a first gate pattern of an output unit and a second gate pattern of the output unit, and the second gate pattern of the output unit is connected to the first gate pattern of the isolation unit; a third insulating layer provided on a side of the first metal layer away from the second insulating layer; a second metal layer provided on a side of the third insulating layer away from the first metal layer; a fourth insulating layer provided on a side of the second metal layer away from the third insulating layer, wherein the fourth insulating layer is provided with a first via hole, a second via hole and a third via hole, wherein the first via hole and the second via hole are both used for exposing an active pattern of the isolation unit, and the third via hole is used for exposing a first gate pattern of the output unit; a third metal layer provided on a side of the fourth insulating layer away from the second metal layer, the third metal layer including a first metal strip and a second metal strip, wherein the first metal strip is connected to the active pattern of the isolation unit via the first via hole, a first end of the second metal strip is connected to the active pattern of the isolation unit via the second via hole, and a second end of the second metal strip is connected to the first gate pattern of the output unit via the third via hole.

Optionally, according to an embodiment of the present disclosure, the semiconductor layer provided on one side of the substrate may specifically include: a first shielding layer disposed on the one side of the substrate; a first insulating layer disposed on a side of the first shielding layer away from the substrate; an oxide semiconductor layer disposed on a side of the first insulating layer away from the first shielding layer, the oxide semiconductor layer including an active pattern of the isolation unit.

Based on the above-mentioned display panel, an embodiment of the present disclosure also provides a method for preparing a display panel. As shown in FIG. 7, the method for preparing the display panel may specifically include the following steps:

step 710, forming a semiconductor layer on a substrate, the semiconductor layer including an active pattern of an isolation unit;

step 720, forming a second insulating layer on a side of the oxide semiconductor layer away from the substrate;

step 730, forming a first metal layer on a side of the second insulating layer away from the oxide semiconductor layer, where the first metal layer includes the first gate pattern of the isolation unit, the first gate pattern of the output unit, and the second gate pattern of the output unit, and the second gate pattern of the output unit is connected to the first gate pattern of the isolation unit;

step 740, forming a third insulating layer on a side of the first metal layer away from the second insulating layer;

step 750, forming a second metal layer on a side of the third insulating layer away from the first metal layer;

step 760, forming a fourth insulating layer on a side of the second metal layer away from the third insulating layer, wherein the fourth insulating layer is provided with a first via hole, a second via hole, and a third via hole; the first via hole and the second via hole are both used for exposing the active pattern of the isolation unit, and the third via hole is used for exposing the first gate pattern of the output unit; and step 770, forming a third metal layer on a side of the fourth insulating layer away from the second metal layer, wherein the third metal layer includes a first metal strip and a second metal strip; the first metal strip is connected to the active pattern of the isolation unit through the first via hole; a first end of the second metal strip is connected to the active pattern of the isolation unit through the second via hole, and a second end of the second metal strip is connected to the first gate pattern of the output unit through the third via hole.

Optionally, in an embodiment of the present disclosure, the forming the semiconductor layer on the substrate may specifically include: forming a first shielding layer on one side of the substrate; forming a first insulating layer on a side of the first shielding layer away from the substrate; and forming an oxide semiconductor layer on a side of the first insulating layer away from the first shielding layer, the oxide semiconductor layer including an active pattern of the isolation unit.

Figure 8:
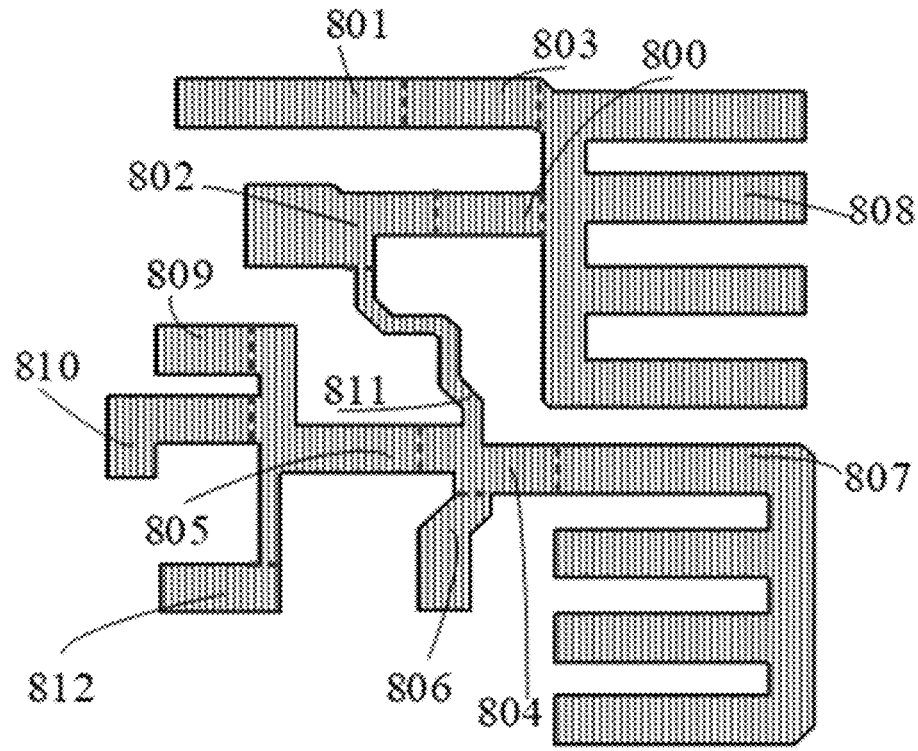
FIG. 8 is a schematic diagram of a pattern of a first shielding layer according to an embodiment of the present disclosure.

As one example of the present disclosure, a bottom shield metal (BSM) as shown in FIG. 8 may be formed on a substrate as a first shielding layer. Subsequently, an inorganic layer may be formed on a side of the first shielding layer away from the substrate to serve as a first insulating layer. The material of the first insulating layer may be inorganic. In a specific implementation, the BSM of each sub-pixel in the display panel may be connected to each other, and the first insulating layer may be on the BSM of each sub-pixel, so that the first insulating layer may cover the BSM of each sub-pixel.

Figure 9:
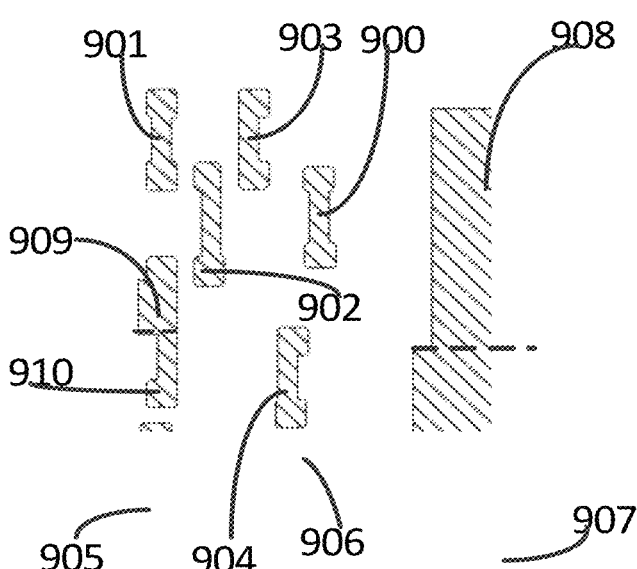
FIG. 9 is a schematic diagram illustrating a pattern of an oxide semiconductor layer according to an embodiment of the present disclosure.

After the first insulating layer is formed, an oxide semiconductor layer may be formed on a side of the first insulating layer away from the BSM, and the oxide semiconductor layer may include an active pattern of the isolation unit. For example, an oxide semiconductor thin film may be deposited by using indium gallium zinc oxide (IGZO) on the basis of BSM and a first insulating layer, and the oxide semiconductor thin film may be patterned by a patterning process to form an oxide semiconductor layer, and as shown in FIG. 9, the oxide semiconductor layer may include an active pattern 900 of a separator transistor T0, an active pattern 901 of a first transistor T1, an active pattern 902 of a second transistor T2, an active pattern 903 of a third transistor T3, an active pattern 904 of a fourth transistor T4, an active pattern 905 of a fifth transistor T5, an active pattern 906 of a sixth transistor T6, an active pattern 907 of a seventh transistor T7, an active pattern 908 of an eighth transistor T8, an active pattern 909 of a ninth transistor T9, and an active pattern 910 of a tenth transistor T10.

The active pattern of the isolation unit may refer to: an active pattern 900 of the separator transistor T0.

Figure 10:
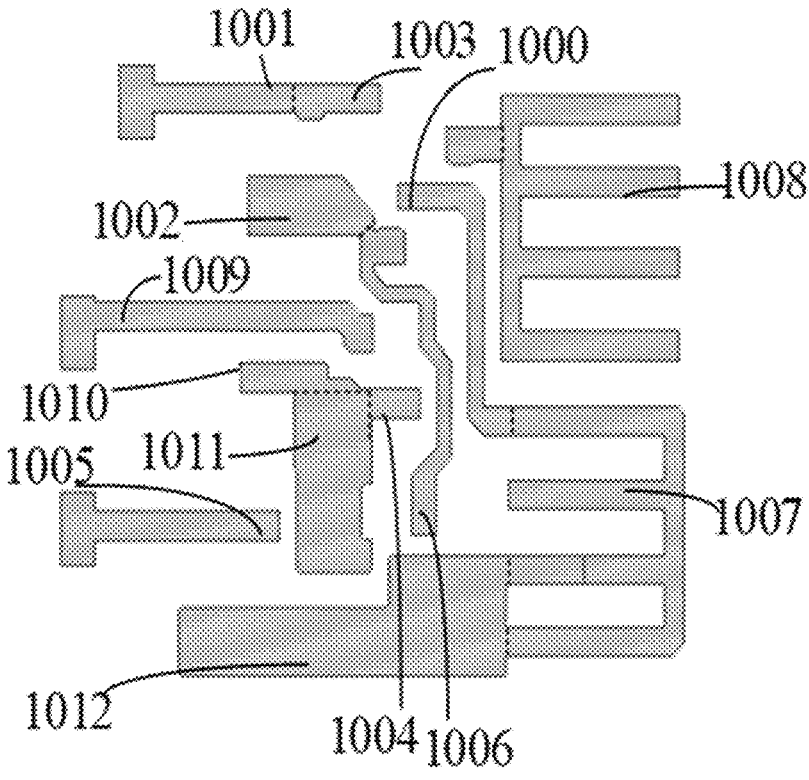
FIG. 10 is a schematic diagram illustrating a pattern of a first metal layer according to an embodiment of the present disclosure.

Subsequently, a second insulating layer may be formed on the side of the oxide semiconductor layer away from the first insulating layer, for example, the second insulating layer may be deposited on the pattern of the oxide semiconductor layer, and then the second insulating layer may be patterned by a patterning process to form the pattern of the second insulating layer, and the material of the second insulating layer may be inorganic, and the embodiments of the present disclosure are not specifically limited thereto. After forming the second insulating layer, a first metal layer may be formed on a side of the second insulating layer away from the oxide semiconductor layer, the first metal layer including: a first gate pattern of the isolation unit, a first gate pattern of the output unit and a second gate pattern of the output unit, and the second gate pattern of the output unit is connected to the first gate pattern of the isolation unit. For example, a first metal film may be deposited on the second insulating layer, and the first metal layer film may be patterned by a patterning process to form the first metal layer as shown in FIG. 10, the orthographic projection of the first metal layer onto the substrate overlaps with the orthographic projection of the first insulating layer onto the substrate.

Optionally, the first metal layer may be used as the first gate layer in the display panel, and specifically may include the gate pattern 1000 of the separator transistor T0, the gate pattern 1001 of the first transistor T1, the gate pattern 1002 of the second transistor T2, the gate pattern 1003 of the third transistor T3, the gate pattern 1004 of the fourth transistor T4, the gate pattern 1005 of the fifth transistor T5, the gate pattern 1006 of the sixth transistor T6, the gate pattern 1007 of the seventh transistor T7, the gate pattern 1008 of the eighth transistor T8, the gate pattern 1009 of the ninth transistor T9, and the gate pattern 1010 of the tenth transistor T10. The gate pattern of each transistor may be disposed, in a straddled manner, on a first electrode layer of the corresponding transistor, and the extension direction of the gate pattern of each transistor may be perpendicular to the extension direction of the active pattern of the corresponding transistor.

In at least one embodiment of the disclosure, the first gate pattern of the isolation unit may refer to a gate pattern 1000 of the separator transistor T0; the first gate pattern of the output unit may refer to the gate pattern 1008 of the eighth transistor T8; the second gate pattern of the output unit may refer to the gate pattern 1007 of the seventh transistor T7.

Optionally, the first metal layer may further include a first capacitor electrode plate 1011 and a second capacitor electrode plate 1012, wherein the first electrode plate may serve as one electrode plate of the first capacitor C1, and the second electrode plate may serve as one electrode plate of the second capacitor C2.

Optionally, in an embodiment of the present disclosure, the shape of the first shielding layer may be the same as the shape of the first metal layer, such that the first shielding layer may cover all channels of the oxide semiconductor layer, and such that the first shielding layer may be connected to the second signal terminal. For example, as shown in FIG. 8, the first shielding layer may include: a first partial shielding pattern 801, a second partial shielding pattern 802, a third partial shielding pattern 803, a fourth partial shielding pattern 804, a fifth partial shielding pattern 805, a sixth partial shielding pattern 806, a seventh partial shielding pattern 807, an eighth partial shielding pattern 808, a ninth partial shielding pattern 809, and a tenth partial shielding pattern 810; and the first partial shielding pattern 801, the second partial shielding pattern 802, the third partial shielding pattern 803, the fourth partial shielding pattern 804, the fifth partial shielding pattern 805, the sixth partial shielding pattern 806, the seventh partial shielding pattern 807, the eighth partial shielding pattern 808, the ninth partial shielding pattern 809, and the tenth partial shielding pattern 810 of the first shielding layer may be interconnected. The eighth partial shielding pattern 808 in the first shielding layer may be shaped as a comb-like structure. For example: the shape of the eighth partial shielding pattern 808 may be the same as the shape of the gate pattern 1008 of the eighth transistor T8, and may have a comb-like structure, as shown in FIG. 8.

Optionally, the eighth partial shielding pattern 808 in the first shielding layer may also be electrically connected to a fixed power supply to reduce the Floating of the shielding layer. For example, the eighth partial shielding pattern 808 may be electrically connected to a low voltage terminal.

Figure 11:
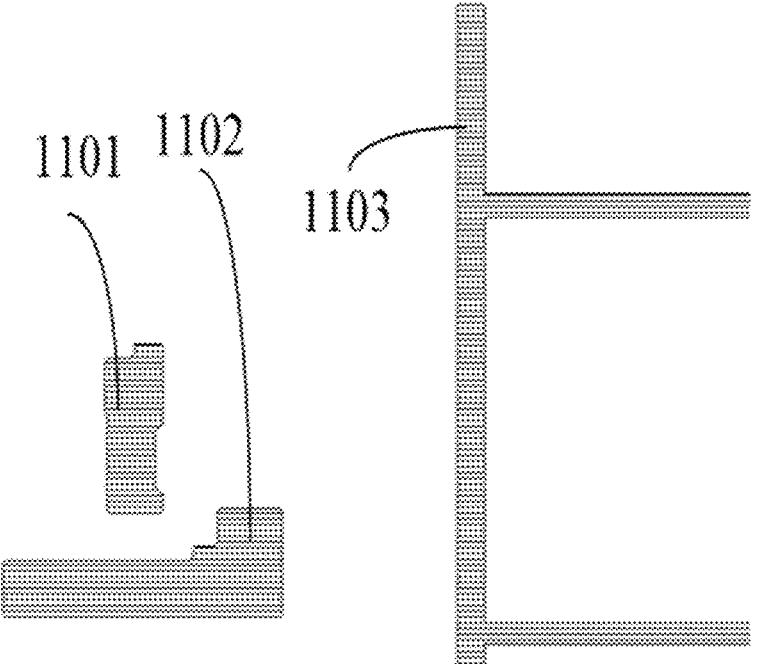
FIG. 11 is a schematic diagram illustrating a pattern of a second metal layer according to an embodiment of the present disclosure.

In this example, after the first metal layer is formed, a third insulating layer may be deposited on the pattern of the first metal layer by using an inorganic substance, and then the third insulating layer may be patterned by a patterning process to form the pattern of the third insulating layer, so that a second metal thin film may be deposited on the basis of the pattern of the third insulating layer, and the second metal thin film may be patterned by the patterning process to form a second metal layer as shown in FIG. 11. The orthographic projection of the second metal layer pattern onto the substrate overlaps the orthographic projection of the second insulating layer onto the substrate.

Optionally, the second metal layer may serve as the second gate layer in the display panel, and specifically may include a third capacitor electrode plate 1101 and a fourth capacitor electrode plate 1102, where the third capacitor electrode plate 1101 may serve as the other electrode plate of the first capacitor C1, and the fourth capacitor electrode plate 1102 may serve as the other electrode plate of the second capacitor C2. The orthographic projection of the third capacitor electrode plate 1101 onto the substrate is located within the orthographic projection of the first capacitor electrode plate 1011 onto the substrate, and the orthographic projection of the fourth capacitor electrode plate 1102 onto the substrate is located within the orthographic projection of the second capacitor electrode plate 1012 onto the substrate. The first capacitor electrode plate 1011 and the third capacitor electrode plate 1101 form the first capacitor C1, and the second capacitor electrode plate 1012 and the fourth capacitor electrode plate 1102 form the second capacitor C2. The second metal layer may also include an output signal terminal 1103.

Figure 12:
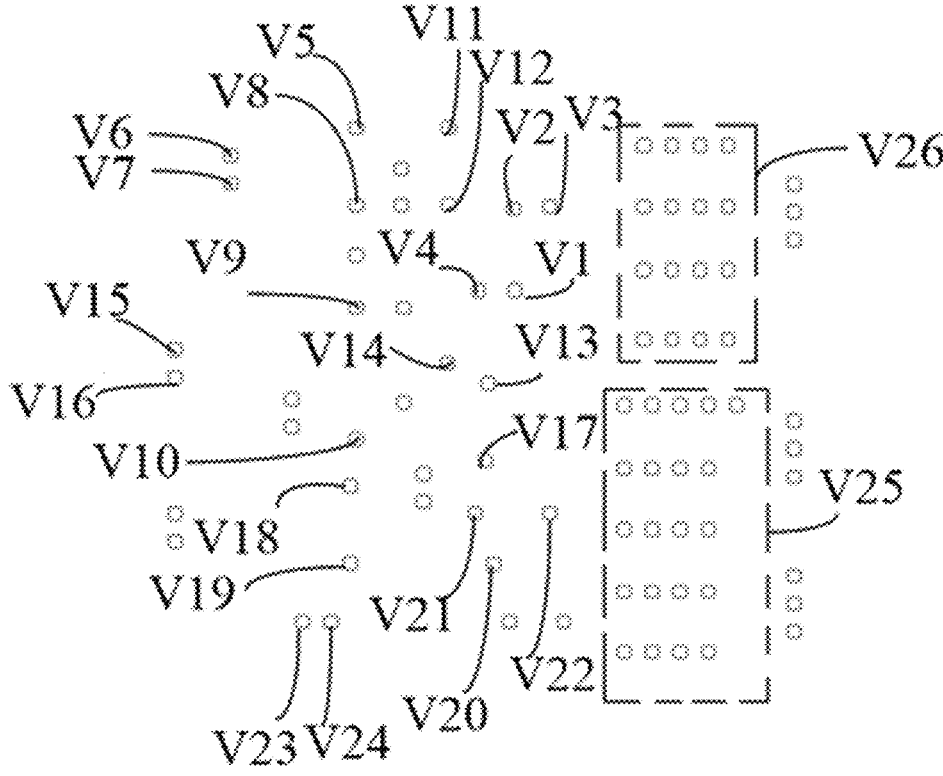
FIG. 12 is a schematic diagram of a via hole pattern according to an embodiment of the present disclosure.

After the second metal layer is formed, a fourth insulating thin film layer may be deposited on the basis of the second metal layer, and the fourth insulating thin film layer may be patterned by a patterning process to form a fourth insulating layer covering the above-mentioned structure, as shown in FIG. 12. The fourth insulating layer can be used as an interlayer insulating layer in the display panel, and a plurality of via holes such as a first via hole V1, a second via hole V2 and a third via hole V3 can be formed in the fourth insulating layer. It is noted that both the first via hole V1 and the second via hole V2 may be used for exposing the active pattern of the isolation unit, and the third via hole V3 may be used for exposing the first gate pattern of the output unit.

Figure 13:
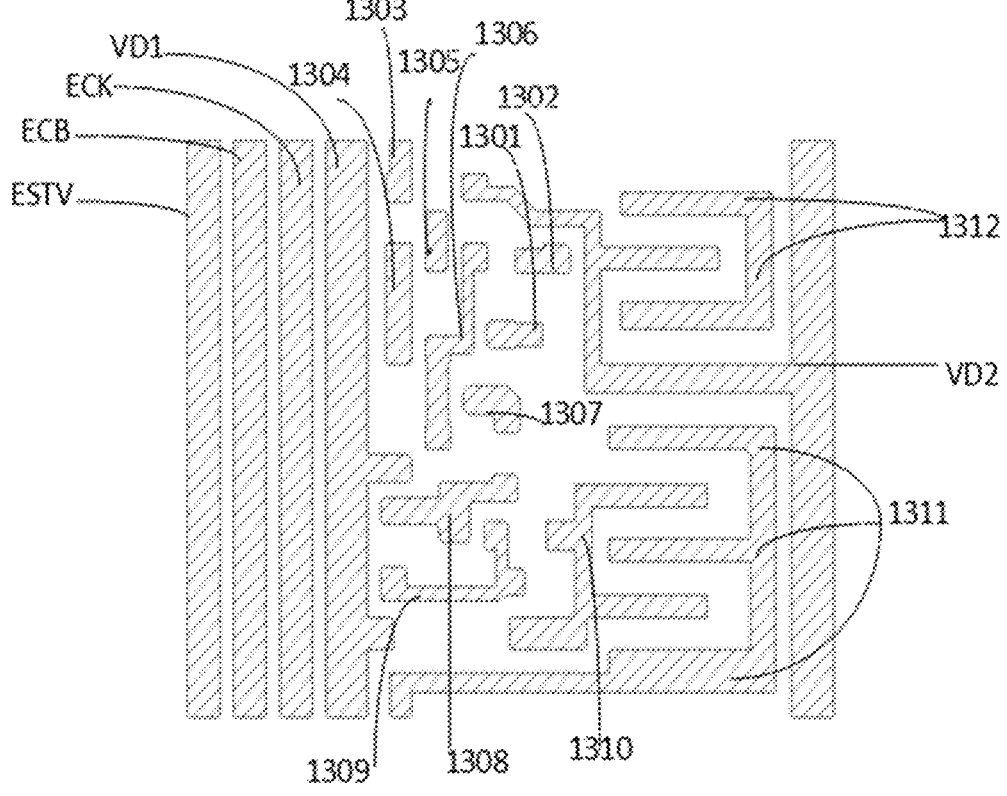
FIG. 13 is a schematic diagram illustrating a pattern of a third metal layer according to an embodiment of the present disclosure.
Figure 14:
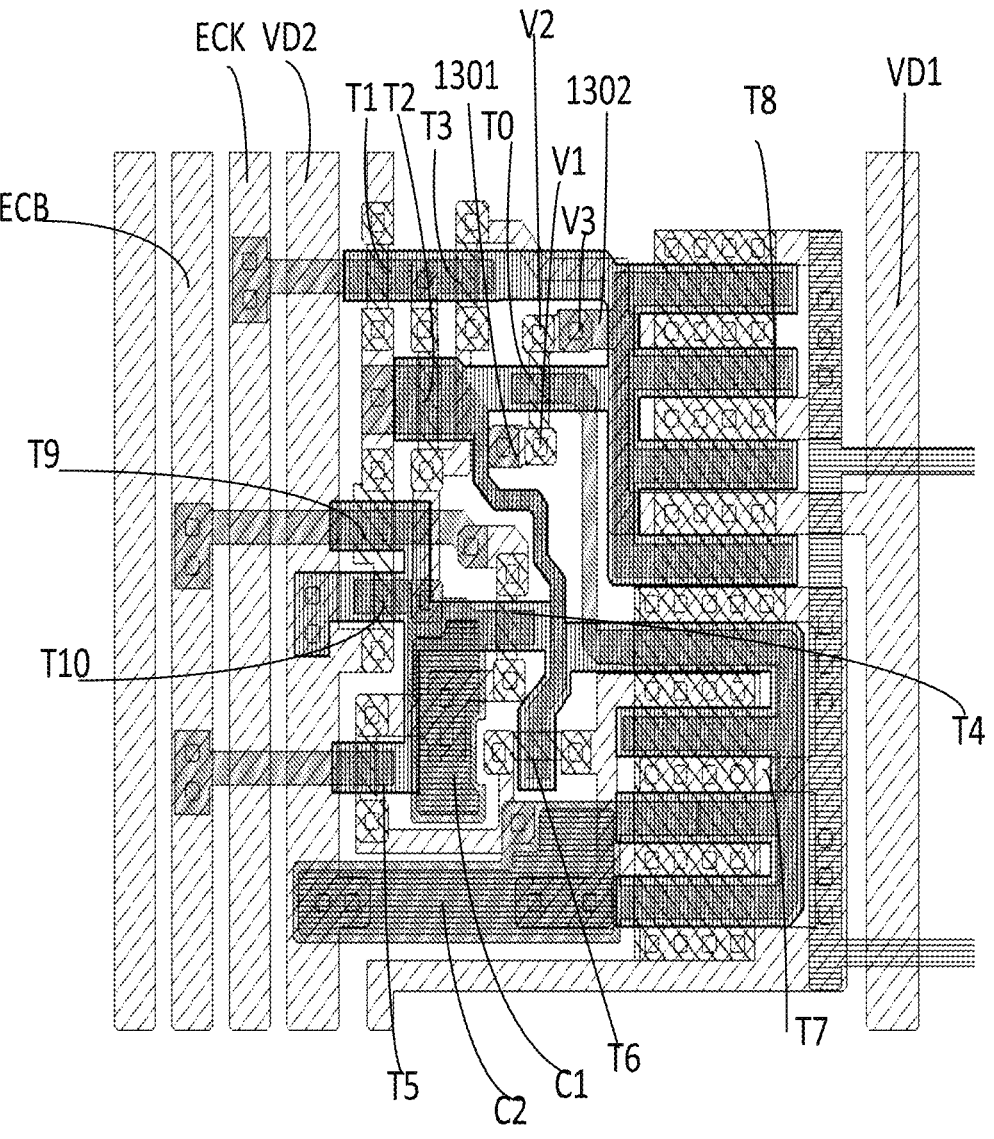
FIG. 14 is a schematic structural diagram of a display panel according to the present disclosure.

After the fourth insulating layer is formed, a third metal layer may be formed on a side of the fourth insulating layer away from the second metal layer to serve as a source drain metal layer in the display panel. As shown in FIG. 13, a pattern of the third metal layer may specifically include a signal input terminal ESTV, a first clock signal terminal ECK, a second clock signal terminal ECB, a first signal terminal VD1, a second signal terminal VD2, a first metal strip 1301, a second metal strip 1302, a third metal strip 1303, a fourth metal strip 1304, a fifth metal strip 1305, a sixth metal strip 1306, a seventh metal strip 1307, an eighth metal strip 1308, a ninth metal strip 1309, a tenth metal strip 1310, an eleventh metal strip 1311, a twelfth metal strip 1312, etc. which are not specifically limited in this example. The signal input terminal ESTV, the first clock signal terminal ECK, the second clock signal terminal ECB, the first signal terminal 131 and the second signal terminal 132 can all be located on the left side of the active pattern of each transistor, and the output terminal EO can be located on the right side of the active pattern of each transistor, as shown in FIG. 13. FIG. 14 is a schematic structural diagram of a display panel according to an embodiment of the present disclosure.

In actual processing, as shown in FIG. 14, the first metal strip 1301 may be connected to the active pattern of the separator transistor T0 through the first via hole V1, the first end of the second metal strip 1302 may be connected to the active pattern of the separator transistor T0 through the second via hole V2, and the second end of the second metal strip 1302 may be connected to the gate pattern of the eighth transistor T8 through the third via hole V3.

In addition, the second end of the first metal strip 1301 can be connected to the active pattern of the first transistor T1 through the fourth via hole V4; a first end of the third metal strip 1303 can be connected to the active pattern of the first transistor T1 through the fifth via hole V5, a first clock signal terminal ECK can be connected to the gate pattern of the first transistor T1 through the sixth via hole V6 and the seventh via hole V7, a first end of the fourth metal strip 1304 can be connected to the active pattern of the first transistor T1 through the eighth via hole V8, and a second end of the fourth metal strip 1304 can be connected to the active pattern of the ninth transistor T9 through the ninth via hole V9; the second signal terminal 132 can be connected to the tenth transistor T10 through the tenth via hole V10; the first clock signal terminal ECK is connected to the gate pattern of the third transistor T3 through the sixth via hole V6 and the seventh via hole V7; the first signal terminal 131 is connected to the active pattern of the third transistor T3 through the eleventh via hole V11, the first end of the fifth metal strip 1305 is connected to the active pattern of the third transistor T3 through the twelfth via hole V12, and the second end of the fifth metal strip 1305 is connected to the active pattern of the second transistor T2 through the twelfth via hole V12; a first end of the sixth metal strip 1306 is connected to the second transistor T2 through the twelfth via hole V12, and a second end of the sixth metal strip 1306 is connected to the first clock signal terminal ECK through the sixth via hole V6 and the seventh via hole V7; a first end of the seventh metal strip 1307 is connected to the active pattern of the fourth transistor T4 through the thirteenth via hole V13, a second end of the seventh metal strip 1307 is connected to the gate layer through the fourteenth via hole V14, the gate layer is connected to the second clock signal line ECB through the fifteenth via hole V15 and the sixteenth via hole V16, a first end of the eighth metal strip 1308 is connected to the active pattern of the fourth transistor T4 through the sixteenth via hole V16, and a second end of the eighth metal strip 1308 is connected to the active pattern of the fifth transistor T5 through the seventeenth via hole V17; the first end of the ninth metal strip 1309 is connected to the active pattern of the fifth transistor T5 through the eighteenth via hole V18, and the second end of the ninth metal strip 1309 is connected to the active pattern of the sixth transistor T6 through the nineteenth via hole V19, the twentieth via hole V20 and the twenty-first via hole V21; a first end of a tenth metal strip 1310 is connected to an active pattern of the sixth transistor T6 through a twenty-second via hole V22, and a second end of the tenth metal strip 1310 is connected to the gate layer and connected to a second signal terminal VD2 through a twenty-third via hole V23 and a twenty-fourth via hole V24; the first end of the eleventh metal strip 1311 is connected to the active pattern of the eighth transistor T8 through the twenty-fifth group of via holes V25, and the second end of the eleventh metal strip 1311 is connected to the output terminal through the twenty-fifth group of via holes V25; the first end of the eleventh metal strip 1311 is connected to the first electrode layer of the eighth transistor T8 through the twenty-fifth group of via holes V25, and the second end of the eleventh metal strip 1311 is connected to the first signal terminal VD1 through the twenty-fifth group of via holes V25; the first end of the twelfth metal strip 1312 is connected to the active pattern of the seventh transistor T7 through the twenty-sixth group of via holes V26, and the second end of the twelfth metal strip 1312 is connected to the output terminal EO through the twenty-sixth group of via holes V26; a first end of the twelfth metal strip 1312 is connected to the active pattern of the seventh transistor T7 through the twenty-sixth group of via holes V26, and a second end of the twelfth metal strip 1312 is connected to the second signal terminal VD2 through the twenty-sixth group of via holes V26.

It can be seen that, in this example, a BSM can be formed on a substrate to serve as a first shielding layer in the display panel, and a double gate structure of a top gate and a bottom gate can be formed in the display panel on the basis of the all-oxide transistors in the shift register, one serving as a double gate and one serving to shield light, and the BSM is connected to a second signal terminal VD2, so that under control of the electrical potential of the fourth node N4 and the electrical potential of the third node N3, the output unit can provide output on the basis of the first signal inputted via the first signal terminal VD1 or the second signal inputted via the second signal terminal VD2, which greatly reduces the risk of outputting Floating, solves the output problem caused by the risk of outputting Floating for a long time in the existing all-oxide EM GOA when outputting a high electrical level, and improves the output stability.

An embodiment of the present disclosure also provides a display apparatus based on the creative concept of the foregoing embodiments, which may specifically include the display panel described in any of the foregoing embodiments.

It is noted that, relational terms used here in, such as "first" and "second", are merely used to distinguish one entity or operation from another entity or operation, without requiring or implying any such an actual relation or sequence existing among these entities or operations. Moreover, "include", "have" and any variations thereof in the present disclosure are intended to cover a non-exclusive inclusion, such that a process, a method, an article, or a device that includes a series of elements not only includes the series of elements, but also may include other elements not expressly listed or include elements inherent in the process, the method, the article, or the device. Without further limitation, an element preceded by "includes or including" does not preclude existence of additional identical elements in the process, the method, the article, or the device including the element.

The previous description of the disclosed embodiments is provided to enable any person skilled in the art to understand or implement the subject matter of the present disclosure. Various modifications to these embodiments will be readily apparent to those skilled in the art, and the generic principles defined herein may be implemented in other embodiments without departing from the spirit or scope of the disclosure. Thus, the present disclosure is not intended to be limited to the embodiments shown herein, but is to be accorded the widest scope consistent with the principles and novel features disclosed herein.

What is claimed is:

1. A shift register, comprising an input unit, a first control unit, an output unit, and an isolation unit, wherein the input unit is configured to provide a starting signal inputted via a signal input terminal to a first node, and providing a first signal inputted via a first signal terminal to a second node;

the first control unit is configured to provide a second clock signal provided by a second clock signal terminal to a third node under control of an electrical potential of the second node and the second clock signal;

the isolation unit is configured to provide a voltage signal of the first node to a fourth node under control of an electrical potential of the third node;

the output unit is configured to provide output based on the first signal or a second signal of a second signal terminal under control of an electrical potential of the fourth node and the electrical potential of the third node;

wherein the first node, the second node, the third node and the fourth node are different nodes.

2. The shift register according to claim 1, wherein the isolation unit comprises a separator transistor;

a gate electrode of the separator transistor is connected to the third node, a first electrode of the separator transistor is connected to the first node, and a second electrode of the separator transistor is connected to the fourth node.

3. The shift register according to claim 1, wherein the input unit comprises a first transistor, a second transistor, and a third transistor;

a gate electrode of the first transistor is connected to a first clock signal terminal, a first electrode of the first transistor is connected to the signal input terminal, and a second electrode of the first transistor is connected to the first node;

a gate electrode of the second transistor is connected to the first node, a first electrode of the second transistor is connected to the first clock signal terminal, and a second electrode of the second transistor is connected to the second node;

a gate electrode of the third transistor is connected to the first clock signal terminal, a first electrode of the third transistor is connected to the first signal terminal, and a second electrode of the third transistor is connected to the second node.

4. The shift register according to claim 1, wherein the first control unit comprises a fourth transistor, a fifth transistor, a sixth transistor, a first capacitor, and a second capacitor;

a gate electrode of the fourth transistor is connected to the second node, a first electrode of the fourth transistor is connected to the second clock signal terminal, and a second electrode of the fourth transistor is connected to a fifth node;

a gate electrode of the fifth transistor is connected to the second clock signal terminal, a first electrode of the fifth transistor is connected to the fifth node, and a second electrode of the fifth transistor is connected to the third node;

a first electrode of the first capacitor is connected to the second node, and a second electrode of the first capacitor is connected to the fifth node;

a first electrode of the second capacitor is connected to the third node, and a second electrode of the second capacitor is connected to the second signal terminal;

a first electrode of the sixth transistor is connected to the second signal terminal, a second electrode of the sixth transistor is connected to the third node, and a gate electrode of the sixth transistor is connected to the first node or the fourth node.

5. The shift register according to claim 1, wherein the output unit comprises a seventh transistor and an eighth transistor;

a gate electrode of the seventh transistor is connected to the third node, a first electrode of the seventh transistor is connected to the second signal terminal, and a second electrode of the seventh transistor is connected to an output terminal;

a gate electrode of the eighth transistor is connected to the fourth node, a first electrode of the eighth transistor is connected to the first signal terminal, and a second electrode of the eighth transistor is connected to the output terminal.

6. The shift register according to claim 1, further comprising a second control unit and a voltage stabilizing unit, wherein the second control unit is configured to write the voltage signal of the first node to a sixth node or writing the second signal provided by the second signal terminal to the sixth node under control of the second clock signal and the electrical potential of the second node;

the voltage stabilizing unit is configured to stabilize a voltage signal of the fourth node.

7. The shift register according to claim 6, wherein the second control unit comprises a ninth transistor and a tenth transistor, and the voltage stabilizing unit comprises a voltage stabilizing capacitor;

a gate electrode of the tenth transistor is connected to the second node, a first electrode of the tenth transistor is connected to the second signal terminal, and a second electrode of the tenth transistor is connected to the sixth node;

a gate electrode of the ninth transistor is connected to the second clock signal terminal, a first electrode of the ninth transistor is connected to the first node, and a second electrode of the ninth transistor is connected to the sixth node; or the gate electrode of the ninth transistor is connected to the first node, the first electrode of the ninth transistor is connected to the second clock signal terminal, and the second electrode of the ninth transistor is connected to the sixth node;

a first electrode plate of the voltage stabilizing capacitor is connected to the fourth node, and a second electrode plate of the voltage stabilizing capacitor is connected to an output terminal or a third signal terminal.

8. A drive method for driving a shift register, wherein the shift register comprises: an input unit, a first control unit, an output unit, and an isolation unit, wherein the input unit is configured to provide a starting signal inputted via a signal input terminal to a first node, and providing a first signal inputted via a first signal terminal to a second node;

the first control unit is configured to provide a second clock signal provided by a second clock signal terminal to a third node under control of an electrical potential of the second node and the second clock signal;

the isolation unit is configured to provide a voltage signal of the first node to a fourth node under control of an electrical potential of the third node;

the output unit is configured to provide output based on the first signal or a second signal of a second signal terminal under control of an electrical potential of the fourth node and the electrical potential of the third node;

wherein the first node, the second node, the third node and the fourth node are different nodes;

wherein the drive method comprises:

providing, by the input unit, the starting signal inputted via the signal input terminal to the first node and providing, by the input unit, the first signal inputted via the first signal terminal to the second node;

providing, by the first control unit under control of the electrical potential of the second node and the second clock signal provided by the second clock signal terminal, the second clock signal to the third node;

providing, by the isolation unit under control of the third node, the voltage signal of the first node to the fourth node; and providing, by the output unit under control of the fourth node and the third node, output based on the first signal or the second signal provided by the second signal terminal.

9. A drive circuit, comprising a plurality of cascaded shift registers according to claim 1, wherein the shift register in a first row is connected to a signal input terminal, a first clock signal terminal, a second clock signal terminal, a first signal terminal, a second signal terminal, and a signal input terminal of the shift register in a second row;

the shift register in a (n+1)-th row is electrically connected to the signal input terminal, the first clock signal terminal, the second clock signal terminal, the first signal terminal, and the second signal terminal of the shift register in a n-th row, and an output terminal of the shift register in the n-th row, n being a positive integer greater than 1.

10. A display panel, comprising a shift register, wherein the shift register comprises: an input unit, a first control unit, an output unit, and an isolation unit, wherein the input unit is configured to provide a starting signal inputted via a signal input terminal to a first node, and providing a first signal inputted via a first signal terminal to a second node;

the first control unit is configured to provide a second clock signal provided by a second clock signal terminal to a third node under control of an electrical potential of the second node and the second clock signal;

the isolation unit is configured to provide a voltage signal of the first node to a fourth node under control of an electrical potential of the third node;

the output unit is configured to provide output based on the first signal or a second signal of a second signal terminal under control of an electrical potential of the fourth node and the electrical potential of the third node;

wherein the first node, the second node, the third node and the fourth node are different nodes;

wherein the display panel further comprises:

a substrate;

a semiconductor layer provided on one side of the substrate, the semiconductor layer comprising an active pattern of the isolation unit;

a second insulating layer provided on a side of the semiconductor layer away from the substrate;

a first metal layer provided on a side of the second insulating layer away from the semiconductor layer, wherein the first metal layer comprises a first gate pattern of the isolation unit, a first gate pattern of the output unit, and a second gate pattern of the output unit, and the second gate pattern of the output unit is connected to the first gate pattern of the isolation unit;

a third insulating layer provided on a side of the first metal layer away from the second insulating layer;

a second metal layer provided on a side of the third insulating layer away from the first metal layer;

a fourth insulating layer provided on a side of the second metal layer away from the third insulating layer, wherein the fourth insulating layer is provided with a first via hole, a second via hole, and a third via hole; the first via hole and the second via hole are both configured to expose the active pattern of the isolation unit, and the third via hole is configured to expose the first gate pattern of the output unit; and a third metal layer provided on a side of the fourth insulating layer away from the second metal layer, wherein the third metal layer comprises a first metal strip and a second metal strip; the first metal strip is connected to the active pattern of the isolation unit through the first via hole; a first end of the second metal strip is connected to the active pattern of the isolation unit through the second via hole, and a second end of the second metal strip is connected to the first gate pattern of the output unit through the third via hole.

11. The display panel according to claim 10, wherein the semiconductor layer provided on one side of the substrate comprises:

a first shielding layer provided on the one side of the substrate;

a first insulating layer provided on a side of the first shielding layer away from the substrate; and an oxide semiconductor layer provided on a side of the first insulating layer away from the first shielding layer, the oxide semiconductor layer comprising the active pattern of the isolation unit.

12. A method for preparing the display panel according to claim 10, comprising:

forming a semiconductor layer on a substrate, the semiconductor layer comprising an active pattern of an isolation unit;

forming a second insulating layer on a side of the semiconductor layer away from the substrate;

forming a first metal layer on a side of the second insulating layer away from the semiconductor layer, wherein the first metal layer comprises a first gate pattern of the isolation unit, a first gate pattern of an output unit, and a second gate pattern of the output unit, and the second gate pattern of the output unit is connected to the first gate pattern of the isolation unit;

forming a third insulating layer on a side of the first metal layer away from the second insulating layer;

forming a second metal layer on a side of the third insulating layer away from the first metal layer;

forming a fourth insulating layer on a side of the second metal layer away from the third insulating layer, wherein the fourth insulating layer is provided with a first via hole, a second via hole, and a third via hole; the first via hole and the second via hole are both configured to expose the active pattern of the isolation unit, and the third via hole is configured to expose the first gate pattern of the output unit; and forming a third metal layer on a side of the fourth insulating layer away from the second metal layer, wherein the third metal layer comprises a first metal strip and a second metal strip; the first metal strip is connected to the active pattern of the isolation unit through the first via hole; a first end of the second metal strip is connected to the active pattern of the isolation unit through the second via hole, and a second end of the second metal strip is connected to the first gate pattern of the output unit through the third via hole.

13. The method according to claim 12, wherein the forming the semiconductor layer on the substrate comprises:

forming a first shielding layer on one side of the substrate;

forming a first insulating layer on a side of the first shielding layer away from the substrate; and forming an oxide semiconductor layer on a side of the first insulating layer away from the first shielding layer, the oxide semiconductor layer comprising the active pattern of the isolation unit.

14. A display apparatus, comprising the display panel according to claim 10.

15. The shift register according to claim 2, further comprising a second control unit and a voltage stabilizing unit, wherein the second control unit is configured to write the voltage signal of the first node to a sixth node or writing the second signal provided by the second signal terminal to the sixth node under control of the second clock signal and the electrical potential of the second node;

the voltage stabilizing unit is configured to stabilize a voltage signal of the fourth node.

16. The shift register according to claim 3, further comprising a second control unit and a voltage stabilizing unit, wherein the second control unit is configured to write the voltage signal of the first node to a sixth node or writing the second signal provided by the second signal terminal to the sixth node under control of the second clock signal and the electrical potential of the second node;

the voltage stabilizing unit is configured to stabilize a voltage signal of the fourth node.

17. The shift register according to claim 4, further comprising a second control unit and a voltage stabilizing unit, wherein the second control unit is configured to write the voltage signal of the first node to a sixth node or writing the second signal provided by the second signal terminal to the sixth node under control of the second clock signal and the electrical potential of the second node;

the voltage stabilizing unit is configured to stabilize a voltage signal of the fourth node.

18. The shift register according to claim 5, further comprising a second control unit and a voltage stabilizing unit, wherein the second control unit is configured to write the voltage signal of the first node to a sixth node or writing the second signal provided by the second signal terminal to the sixth node under control of the second clock signal and the electrical potential of the second node;

the voltage stabilizing unit is configured to stabilize a voltage signal of the fourth node.

\* \* \* \* \*